United States Patent
Suda et al.

(10) Patent No.: US 10,922,608 B2
(45) Date of Patent: Feb. 16, 2021

(54) SPIKING NEURAL NETWORK

(71) Applicant: ARM LTD, Cambridge (GB)

(72) Inventors: Naveen Suda, San Jose, CA (US);
Vikas Chandra, Fremont, CA (US);
Brian Tracy Cline, Austin, TX (US);
Saurabh Pijuskumar Sinha, San Antonio, TX (US); Shidhartha Das, Upper Cambourne (GB)

(73) Assignee: ARM LTD, Cambridge (GB)

( * ) Notice: Subject to any disclaimer, the term of this patent is extended or adjusted under 35 U.S.C. 154(b) by 1016 days.

(21) Appl. No.: 15/452,792

(22) Filed: Mar. 8, 2017

(65) Prior Publication Data
US 2018/0260696 A1 Sep. 13, 2018

(51) Int. Cl.
*G06N 3/08* (2006.01)
*G06N 3/04* (2006.01)
*G06N 3/063* (2006.01)

(52) U.S. Cl.
CPC .............. *G06N 3/08* (2013.01); *G06N 3/04* (2013.01); *G06N 3/049* (2013.01); *G06N 3/0635* (2013.01)

(58) Field of Classification Search
CPC ............ G06N 3/08; G06N 3/04; G06N 3/049; G06N 3/0635
See application file for complete search history.

(56) References Cited

U.S. PATENT DOCUMENTS

| | | | |
|---|---|---|---|
| 9,548,118 B1 * | 1/2017 | Bhavnagarwala | G11C 13/0002 |
| 9,589,636 B1 * | 3/2017 | Bhavnagarwala | G11C 13/0007 |
| 9,621,161 B1 * | 4/2017 | Das | H03K 19/00323 |
| 10,002,665 B1 * | 6/2018 | Bhargava | G11C 13/0002 |
| 2012/0011092 A1 | 1/2012 | Tang et al. | |
| 2017/0033782 A1 | 2/2017 | Shifren | |

FOREIGN PATENT DOCUMENTS

WO  WO 2018/007783  1/2018

OTHER PUBLICATIONS

M. Ignatov et al., "A memristive spiking neuron with firing rate coding," Frontiers in Neuroscience, vol. 9, 376, Oct. 20, 2015.
J.W. Jang et al., "Scalable neuron circuit using conductive-bridge RAM for pattern reconstructions," IEEE Transactions on Electron Devices, vol. 63, No. 6, Apr. 8, 2016.
M. Al-Shedivat et al., "Memristors empower spiking neurons with stochasticity," IEEE Journal on Emerging and Selected Topics in Circuits and Systems, vol. 5, No. 2, Jun. 3, 2015.
G.W. Burr et al., "Neuromorphic computing using non-volatile memory," Advances in Physics: X, vol. 2, No. 1, Dec. 4, 2016.
T. Tuma et al., "Stochastic phse-change neurons," Nature Nanotechnology, vol. 11, No. 8, May 16, 2016.
S. Afshar et al., "Emergence of competitive control in a memristor-based neuromorphic circuit," Procedding of the 2012 International Joint Conference on Neural Networks, Jun. 10, 2012.

\* cited by examiner

*Primary Examiner* — Pho M Luu
(74) *Attorney, Agent, or Firm* — Leveque Intellectual Property Law, P.C.

(57) ABSTRACT

Broadly speaking, embodiments of the present technique provide a neuron for a spiking neural network, where the neuron is formed of at least one Correlated Electron Random Access Memory (CeRAM) element or Correlated Electron Switch (CES) element.

14 Claims, 17 Drawing Sheets

200

201
202
203

210

400

CES element in LRS

SPIKING NEURAL NETWORK

FIELD OF THE INVENTION

The present techniques generally relate to a hardware-based spiking neural network, and in particular to CEM-based neuron circuits for a spiking neural network.

BACKGROUND

A Correlated Electron Switch (CES) element is formed (wholly or in part) from a correlated electron material (CEM), which exhibits an abrupt conductive or insulative state transition arising from electron correlations rather than solid state structural phase changes. CES elements are a type of non-volatile memory, i.e. CES elements do not lose their state after power supplied to the CES elements is removed.

A spiking neural network is a type of neural network model in which a neuron fires when a membrane potential of the neuron reaches or exceeds a threshold value. The spiking neural network mimics the function and properties of biological spiking neurons (cells) in an animal nervous system which generate sharp electrical potentials across their cell membranes. A biological spiking neuron typically produces/outputs a spike (also known as an action potential) when the electrical input into the neuron (e.g. voltage or current) reaches or exceeds a threshold value. An input current applied to a spiking neuron (also known as an integrate-and-fire neuron) causes the voltage across the membrane of the neuron to increase until it reaches a threshold voltage. When the threshold voltage is reached, the spiking neuron outputs a spike (e.g. a sharp change in voltage, as may be represented by a delta function). The voltage across the membrane is reset to a resting potential after the spike is outputted. The threshold voltage for spiking neurons may depend on biological cell type.

SUMMARY

Broadly speaking, the techniques described herein provide a neuron circuit for use in a hardware-based spiking neural network. The techniques described herein also implement a dot-product computation of weights and input values in a spiking neural network. The spiking neural network may be formed of layers of interconnected spiking neurons (or neural network nodes), where the connections (or edges) are associated with a number/weight. The term "dot-product" used herein refers to the multiplication of a weight associated with each in-edge of, or connection into, a spiking neuron with the magnitude of the signal (e.g. voltage, current, etc.) along that in-edge. The computation performed at each spiking neuron may occur in two distinct steps. The first step comprises summing the products of the weights and the input magnitudes (dot-product). The second step comprises using this sum as an input to an activation function of the spiking neuron. The activation function defines the output of the spiking neuron, and for a spiking neuron is binary (e.g. 'fire' or 'don't fire', or 'output a spike' or 'don't output a spike'). For a spiking neuron, the activation function is related to a threshold value of the spiking neuron, which could be considered a weight value. The spiking neuron may be configured to fire (output a spike) when a membrane potential of the neuron reaches or exceeds a threshold value, and not fire when a membrane potential is below the threshold value. The present techniques provide hardware/circuitry for a low-power, small-area, energy-efficient implementation of a spiking neuron and of the dot-product (multiply-and-accumulate) computation with a spiking neural network.

According to a first embodiment of the present techniques there is provided a spiking neuron for a spiking neural network, the spiking neuron comprising: a correlated electron switch (CES) element for implementing a thresholding function of the spiking neuron.

In embodiments, the spiking neuron may comprise an accumulator circuit for summing current signals received by the spiking neuron to provide an accumulated current signal.

The CES element may store a threshold current value corresponding to a compliance current. The spiking neuron may further comprise: a comparator circuit for: comparing the accumulated current signal with the threshold current value stored by the CES element, and outputting a spike signal if the accumulated current signal is greater than or equal to the threshold current value.

The spiking neuron may comprise a further CES element for storing the accumulated current signal as a compliance current.

The comparator circuit may comprise: a first mirror circuit for mirroring the accumulated current signal stored in the further CES element; and a second mirror circuit for mirroring the threshold current value stored by the CES element.

In embodiments, the CES element may be programmed into an initial high impedance state. The spiking neuron may further comprise: circuitry for applying voltage Vset across the CES element, wherein the spiking neuron outputs a spike when the accumulated current signal exceeds a threshold current Iset and causes the CES element to switch out of the initial high impedance state.

In embodiments, the CES element may be programmed into one of a plurality of low impedance states. The spiking neuron may further comprise: circuitry for applying voltage Vreset across the CES element, wherein the spiking neuron outputs a spike when the accumulated current signal exceeds a threshold current Ireset, and causes the CES element to switch into a high impedance state upon application of voltage Vreset. The circuitry for applying voltage Vreset across the CES element may comprise a capacitor provided in a parallel arrangement with the CES element.

The accumulator circuit for summing the signals received by the input node may comprise a crosspoint array for applying weights to the received signals.

According to a second embodiment of the present techniques, there is provided a synapse for a spiking neural network, the synapse comprising: a crosspoint array comprising: at least one row signal line and at least one column signal line; and a plurality of programmable CES elements provided at each intersection of a row signal line and a column signal line, wherein each CES element is programmable into a high impedance state or one of a plurality of low impedance states.

The synapse may comprise input nodes coupled to each row signal line, for receiving current signals from the spiking neural network; and output nodes coupled to each column signal line, wherein each output node is couplable to a spiking neuron.

The synapse may comprise circuitry for coupling the crosspoint array to calibration circuitry for writing the programmable CES elements into a required impedance state.

According to a third embodiment of the present techniques, there is provided a method of outputting spike signals from a spiking neuron, the method comprising: using a correlated electron switch (CES) element to implement a thresholding function of the spiking neuron.

The method may comprise accumulating two or more current signals received from the spiking neural network to provide an accumulated current signal; and outputting a spike signal.

The CES element may store a threshold current. The method may comprise: comparing the stored threshold current and the accumulated current signal; determining if the accumulated current signal is greater than or equal to the stored threshold current; and outputting, responsive to the determining, the spike signal.

The method may comprise: programming the CES element into one of a plurality of low impedance states to store a threshold current value; and applying, subsequent to the programming, a voltage Vreset across the CES element.

The method may comprise: outputting the spike signal when the accumulated current signal exceeds a threshold current Ireset and causes the CES element to switch out of the low impedance state upon application of voltage Vreset.

The method may comprise: programming the CES element into a high impedance state to store a threshold current value; and applying, subsequent to the programming, a voltage Vset across the CES element.

The method may comprise: outputting the spike signal when the accumulated current signal exceeds a threshold current Iset and causes the CES element to switch out of the high impedance state.

The method may comprise: resetting the spiking neuron subsequent to outputting a spike signal.

BRIEF DESCRIPTION OF THE DRAWINGS

The techniques are diagrammatically illustrated, by way of example, in the accompanying drawings, in which.

DETAILED DESCRIPTION

Figure 1:
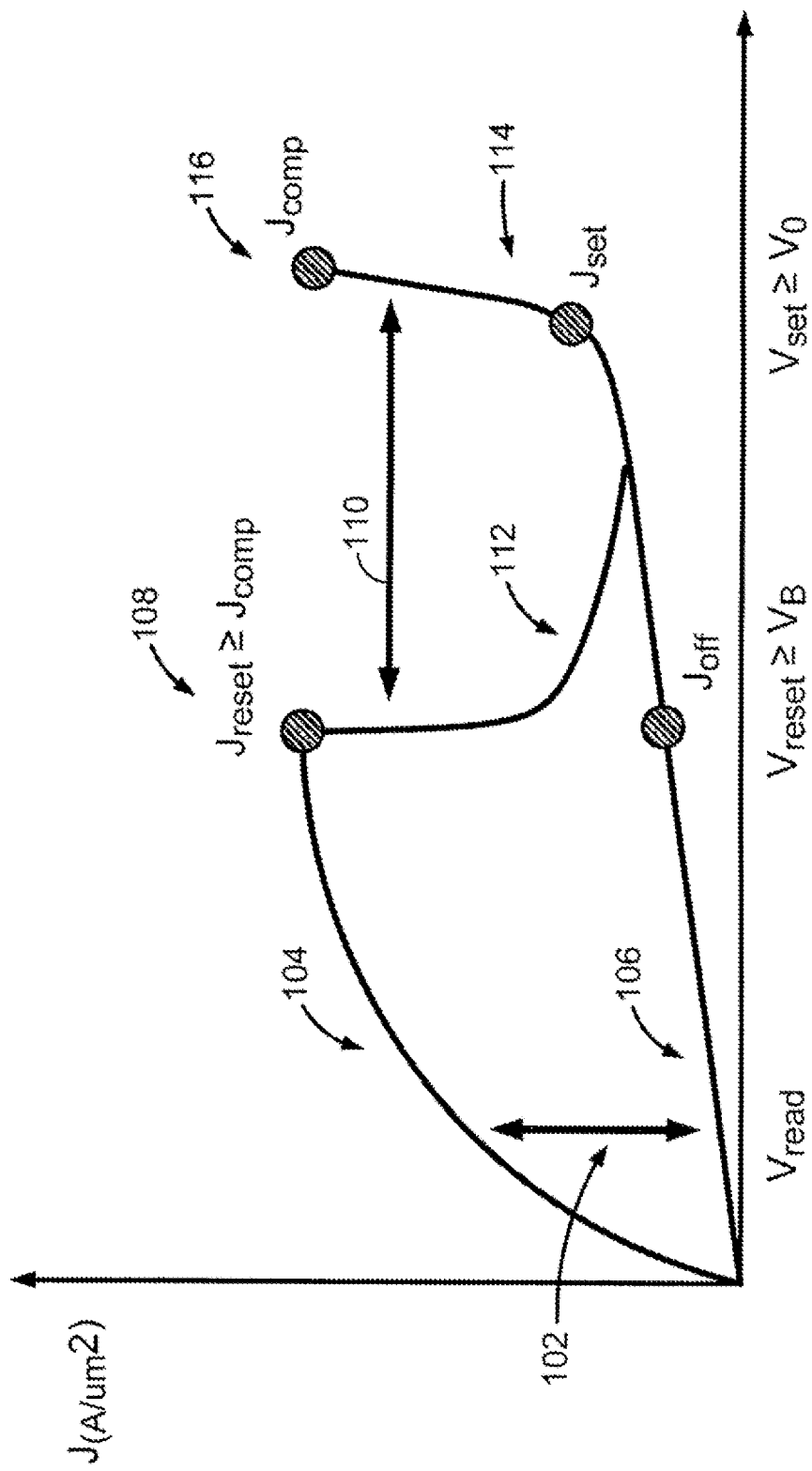
FIG. 1 shows an example plot of current density against voltage for a correlated electron switch (CES) element.

Broadly speaking, embodiments of the present technique provide a neuron for a spiking neural network, where the neuron is formed of at least one Correlated Electron Random Access Memory (CeRAM) element or Correlated Electron Switch (CES) element. Embodiments also provide a reconfigurable hardware-based spiking neural network A spiking neural network is a type of neural network model in which a neuron fires when a membrane potential of the neuron reaches or exceeds a threshold value.

The spiking neural network described herein is a reconfigurable hardware-based artificial spiking neural network comprising electrical neurons that perform substantially the same functions as biological spiking neurons. The weights for each node of the artificial spiking neural network may be obtained via training performed external to the neural network. Thus, the techniques described herein may be particularly useful for implementing an artificial neural network in a resource-constrained device, such as an Internet of Things (IoT) device or an embedded device which typically have limited processing and/or memory capabilities. Such constrained devices may not have the capabilities to train an artificial neural network in situ.

The neurons of the present techniques each comprise at least one correlated electron switch (CES) element to store a threshold current. The neuron is configured to fire when the current accumulated in the neuron equals or exceeds the threshold current. Generally speaking, each CES element is switchable between an insulative state (or high impedance state) and at least one conductive state (or low impedance state). A CES element may be switched into one of a plurality of low impedance states depending on the compliance current applied to the CES element. Thus, varying the compliance current applied to a CES element may enable the CES element to be set into a specific low impedance state. As a result, the CES element may be able to store a specific threshold current (or voltage) for the neuron.

The term "correlated electron switch" is used interchangeably herein with "CES", "CES element", "CES device", "correlated electron random access memory", "CeRAM", "CeRAM device", and "CeRAM element".

A CES element is a particular type of switch formed (wholly or in part) from a correlated electron material (CEM). Generally speaking, a CES may exhibit an abrupt conductive or insulative state transition arising from electron correlations rather than solid state structural phase changes. (Examples of solid state structural phase changes include crystalline/amorphous in phase change memory (PCM)

devices, or filamentary formation and conduction in resistive RAM devices, as discussed above). An abrupt conductor/insulator transition in a CES may be responsive to a quantum mechanical phenomenon, in contrast to melting/solidification or filament formation.

A quantum mechanical transition of a CES between an insulative state and a conductive state may be understood in terms of a Mott transition. In a Mott transition, a material may switch from an insulative state to a conductive state if a Mott transition condition occurs. When a critical carrier concentration is achieved such that a Mott criteria is met, the Mott transition will occur and the state will change from high resistance/impedance (or capacitance) to low resistance/impedance (or capacitance).

A "state" or "memory state" of the CES element may be dependent on the impedance state or conductive state of the CES element. In this context, the "state" or "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative states. As discussed in the particular example implementations below, material of a CES element sandwiched between conductive terminals may be placed in an insulative state by application of a first programming signal across the terminals having a voltage $V_{reset}$ and current $I_{reset}$ at a current density $J_{reset}$, or placed in a conductive state by application of a second programming signal across the terminals having a voltage $V_{set}$ and current $I_{set}$ at current density $J_{set}$.

Additionally or alternatively, a CES element may be provided as a memory cell in a cross-point memory array whereby the CES element may comprise a metal/CEM/metal (M/CEM/M) stack formed on a semiconductor. Such an M/CEM/M stack may be formed on a diode, for example. In example implementations, such a diode may be selected from the group consisting of a junction diode and a Schottky diode. In this context, it should be understood that "metal" means a conductor, that is, any material that acts like a metal, including, for example, polysilicon or a doped semiconductor.

FIG. 1 shows an example plot of current density against voltage across terminals (not shown) of a correlated electron switch (CES) element. Based, at least in part, on a voltage applied to terminals of the CES element (e.g., in a write operation), the CES may be placed in a conductive state or an insulative state. For example, application of a voltage $V_{set}$ and current density $J_{set}$ may place the CES element in a conductive memory state and application of a voltage $V_{reset}$ and a current density $J_{reset}$ may place the CES element in an insulative memory state.

Following placement of the CES in an insulative state or conductive state, the particular state of the CES element may be detected by application of a voltage $V_{read}$ (e.g., in a read operation) and detection of, for example, a current or current density at terminals or bias across the terminals of the CES element.

Both the current and the voltage of the CES element need to be controlled in order to switch the CES element state. For example, if the CES element is in a conductive state, and voltage $V_{reset}$, required to place the device in an insulative memory state, is applied thereto, the CES element will not switch into the insulative state until the current density is also at the required value of $J_{reset}$. This means that, when the CES element is used to read/write from a memory, unintended rewrites may be prevented since even if sufficient voltage is applied to the CES element, a memory state change will only occur if the required current density is also applied.

The CES element may include any transition metal oxide (TMO), such as, for example, perovskites, Mott insulators, charge exchange insulators, and Anderson disorder insulators. In particular implementations, a CES element may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES element may be prepared without electroforming. Other implementations may employ other transition metal compounds without deviating from claimed subject matter. For example, {M(chxn)2Br}Br2 where M may comprise Pt, Pd, or Ni, and chxn comprises 1R,2R-cyclohexanediamine, and other such metal complexes may be used without deviating from claimed subject matter.

When sufficient bias is applied (e.g., exceeding a band-splitting potential) and the aforementioned Mott condition is met (injected electron holes=the electrons in a switching region), the CES element may rapidly switch from a conductive state to an insulative state via the Mott transition. This may occur at point 108 of the plot in FIG. 1. At this point, electrons are no longer screened and become localized. This correlation may result in a strong electron-electron interaction potential which splits the bands to form an insulator. While the CES element is still in the insulative state, current may be generated by transportation of electron holes. When sufficient bias is applied across terminals of the CES, electrons may be injected into a metal-insulator-metal (MIM) diode over the potential barrier of the MIM device. When sufficient electrons have been injected and sufficient potential is applied across terminals to place the CES element in a set state, an increase in electrons may screen electrons and remove a localization of electrons, which may collapse the band-splitting potential forming a metal.

Current in a CES element may be controlled by an externally applied "compliance" condition determined based, at least in part, on the external current limited during a write operation to place the CES element in a conductive state. This externally applied compliance current may also set a condition of a current density for a subsequent reset operation to place the CES in an insulative state.

As shown in the particular implementation of FIG. 1, a current density $J_{comp}$ applied during a write operation at point 116 to place the CES element in a conductive state may determine a compliance condition for placing the CES element in an insulative state in a subsequent write operation. For example, the CES element may be subsequently placed in an insulative state by application of a current density $J_{reset} \geq J_{comp}$ at a voltage $V_{reset}$ at point 108, where $J_{comp}$ is externally applied.

The compliance condition therefore may set a number of electrons in a CES element which are to be "captured" by holes for the Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 108. As pointed out above, such a Mott transition may occur at condition in a CES element in which a concentration of electrons n equals a concentration of electron holes p.

A current or current density in a region 104 of the plot shown in FIG. 1 may exist in response to injection of holes from a voltage signal applied across terminals of a CES element. Here, injection of holes may meet a Mott transition criterion for the conductive state to insulative state transition at current IMI as a critical voltage VMI is applied across terminals of CES element.

A "read window" 102 for detecting a memory state of a CES element in a read operation may be set out as a difference between a portion 106 of the plot of FIG. 1 while the CES element is in an insulative state (i.e. a high impedance state), and a portion 104 of the plot of FIG. 1 while the CES element is in a conductive state (i.e. in a low impedance state) at a read voltage $V_{read}$.

Similarly, a "write window" 110 for placing a CES element in an insulative or conductive memory state in a write operation may be set out as a difference between $V_{reset}$(at $J_{reset}$) and $V_{set}$(at $J_{set}$). Establishing $|V_{set}| > |V_{reset}|$ enables a switch between conductive and insulative states. $V_{reset}$ may be approximately at a band splitting potential arising from correlation and $V_{set}$ may be approximately twice the band splitting potential. In particular implementations, a size of write window 110 may be determined, at least in part, by materials and doping of the CES element. The transition from high resistance (or high capacitance) to low resistance (or low capacitance) can be represented by a singular impedance of the device. Portion 112 of the plot of FIG. 1 shows the current consumption as a CES element undergoes a transition from a low impedance state to a high impedance state, while portion 114 of the plot shows the current consumption as a CES element undergoes a transition from a high impedance state to a low impedance state.

Figure 2A:
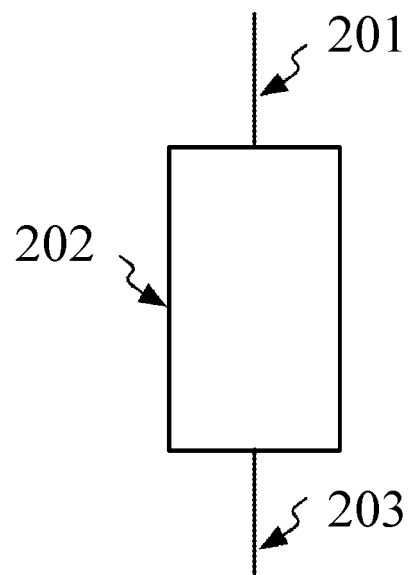
FIG. 2A is block diagram of an example embodiment of a correlated electron switch (CES) element comprising a correlated electron material.

FIG. 2A is block diagram of an example embodiment of a correlated electron switch (CES) element 200 comprising a correlated electron material (CEM) 202. The correlated electron material 202 may be sandwiched between conductive terminals, such as conductive terminals 201 and 203. In an embodiment, a CES device, such as CES device 200, may comprise a variable impeder device. As utilized herein, the terms "correlated electron switch" and "variable impeder" may be interchangeable. At least in part through application of a critical voltage and a critical current between the terminals, such as between conductive terminals 201 and 203, the CEM, such as material 202, may transition between the aforementioned conductive/lower impedance state and insulative/higher impedance state. As mentioned earlier, CEM, such as material 202, in a variable impeder device, such as CES device 200, may transition between a first impedance state and a second impedance state due to a quantum mechanical transition of the correlated electron switch material because of an applied critical voltage and an applied critical current, as described in more detail below.

Also, as mentioned above, a variable impeder device, such as variable impeder device 200, may exhibit properties of both variable resistance and variable capacitance.

In a particular embodiment, a variable impeder device, such as CES device 200, may comprise a CEM that may transition between or among a plurality of detectable impedance states based, at least in part, on a transition of at least a majority portion of the CEM between an insulative/higher impedance state and a conductive/lower impedance state due to a quantum mechanical transition of the correlated electron switch material. For example, in an embodiment, a CES device may comprise a bulk switch, in that substantially all of a CEM of a CES device may switch from an insulative/higher impedance state to a conductive/lower impedance state or from a conductive/lower impedance state to an insulative/higher impedance state responsive to a Mott-transition. In this context, an "impedance state" means a detectable state of a variable impeder device that is indicative of a value, symbol, parameter and/or condition, just to provide a few examples. In one particular embodiment, as described below, an impedance state of a CES device may be detected based, at least in part, on a signal detected on terminals of the CES device in a read and/or sense operation. In another particular embodiment, as described below, a CES device may be placed in a particular impedance state to represent or store a particular value, symbol, and/or parameter, and/or to achieve a particular capacitance value for the CES device by application of one or more signals across terminals of the CES device in a "write" and/or "program" operation, for example. Of course, claimed subject matter is not limited in scope to the particular example embodiments described herein.

Figure 2B:
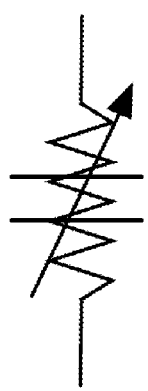
FIG. 2B is an example circuit symbol for a CES element.

FIG. 2B depicts an example symbol 210 that may be utilized, for example, in electrical circuit schematic diagrams to notate a CES/variable impeder device. Example symbol 210 is meant to remind the viewer of the variable resistance and variable capacitance properties of a CES/variable impeder device, such as CES device 200. Example symbol 210 is not meant to represent an actual circuit diagram, but is merely meant as an electrical circuit diagram symbol. Of course, claimed subject matter is not limited in scope in these respects.

Figure 3:
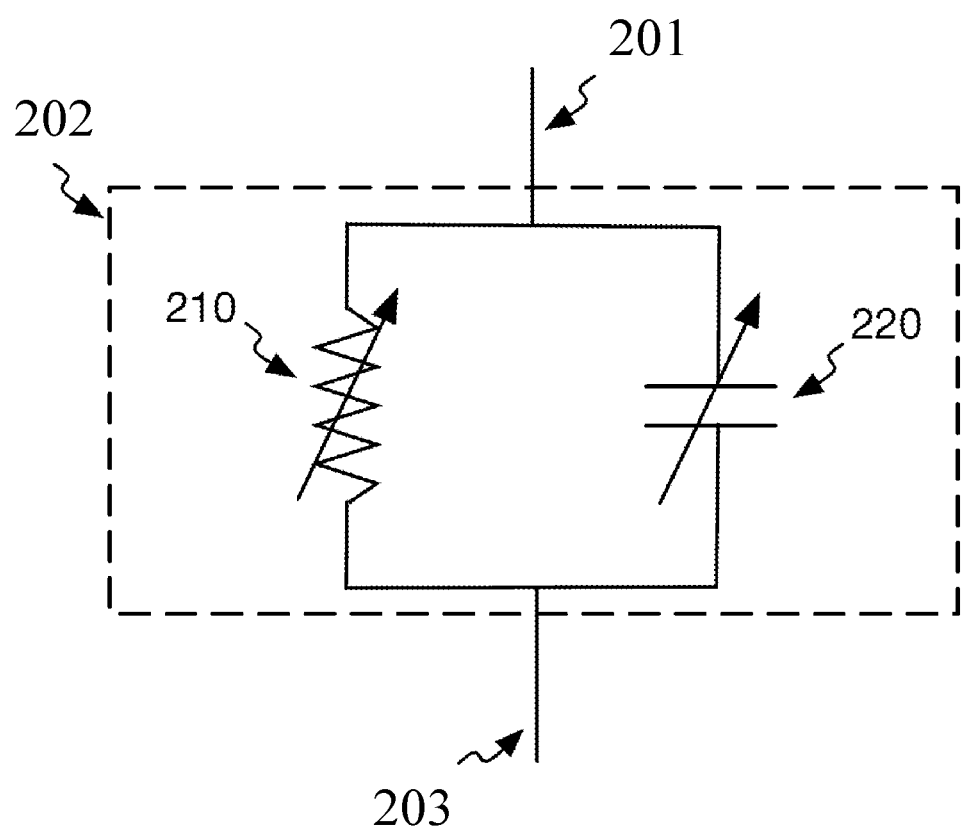
FIG. 3 is an example equivalent circuit for a CES element.

FIG. 3 depicts a schematic diagram of an equivalent circuit 300 of an example variable impeder device (such as a CES device), such as variable impeder device 202. As mentioned, variable impeder device 202 may comprise characteristics of both variable resistance and variable capacitance. For example, an equivalent circuit for a variable impeder device may, in an embodiment, comprise a variable resistor, such as variable resistor 210 in parallel with a variable capacitor, such as variable capacitor 220. Although the variable resistor 210 and variable capacitor 220 are depicted in FIG. 3 as discrete components, variable impeder device 202 may equally comprise a substantially homogenous CES element, wherein the CES element comprises characteristics of variable capacitance and variable resistance. Table 1 below depicts an example truth table for an example variable impedance device, such as variable impeder device 202.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

In an embodiment, the example truth table shown in Table 1 shows that a resistance of a variable impeder device, such as CES device 202, may transition between a lower resistance state and a higher resistance state that is a function, at least in part, of a voltage applied across the CEM. In an embodiment, a resistance of a lower resistance state may be 10 to 100,000 times lower than a resistance of a higher resistance state, although claimed subject matter is not limited in scope in this respect. Similarly, Table 1 shows that a capacitance of a variable impeder device, such as CES device 202, may transition between a lower capacitance state, which for an example embodiment may comprise approximately zero, or very little, capacitance, and a higher capacitance state that is a function, at least in part, of a voltage applied across the CEM. Also, as shown in Table 1, a variable impeder device's transition from a higher resistance/higher capacitance state to a lower resistance/lower capacitance state may be represented as a transition from a higher impedance state to a lower impedance state. Similarly, a transition from a lower resistance/lower capacitance state to a higher resistance/higher capacitance state may be represented as a transition from a lower impedance state to a higher impedance state.

It should be noted that a variable impeder, such as CES 202, is not a resistor, but rather comprises a device having properties of both variable capacitance and variable resistance. In an embodiment, resistance and/or capacitance values, and therefore impedance values, depend, at least in part, on an applied voltage.

As used herein, the terms "conductive state", "lower impedance state", and/or "metal state" may be interchangeable, and/or may at times be referred to as a "conductive/lower impedance state". Similarly, the terms "insulative state" and "higher impedance state" may be used interchangeably herein, and/or may at times be referred to as an "insulative/higher impedance state". The term "impedance state" is used interchangeably herein with the terms "resistance state" and "capacitance state".

In this context, it should be understood that the term "low impedance state" (also referred to herein as "LIS", and used to mean a low impedance and low capacitance), and the term "high impedance state" (also referred to herein as "HIS", and used to mean a high impedance and high capacitance) are relative terms and not specific to any particular quantity or value for conductance, impedance, or capacitance. For example, whilst in a first memory state the CES element may be more conductive (or less insulative), than while the CES element is in a second memory state.

Figure 4:
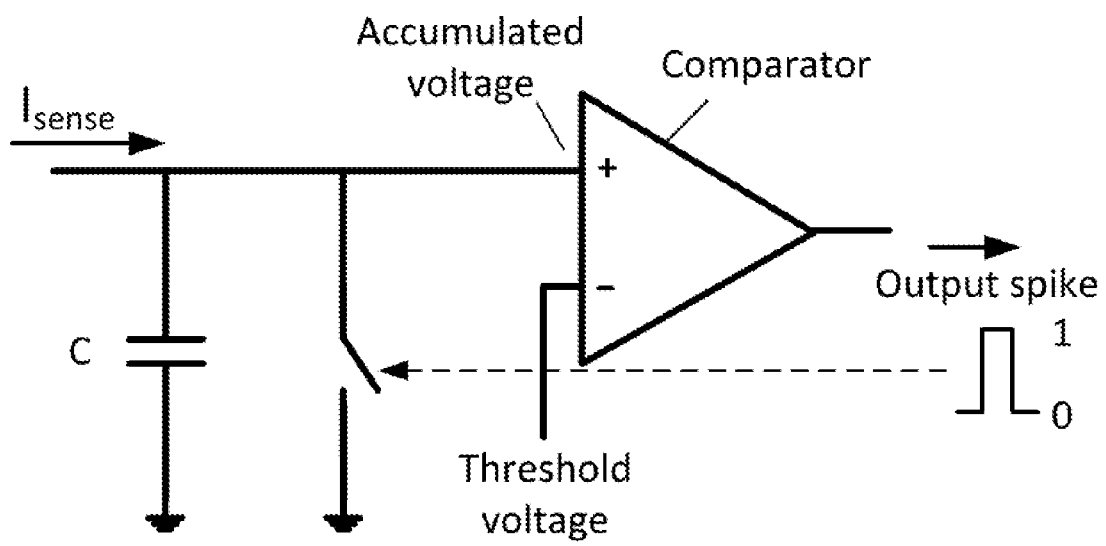
FIG. 4 is a circuit diagram of an integrate-and-fire neuron.

FIG. 4 is a circuit diagram of an integrate-and-fire neuron 400. Typically, a hardware-based implementation of a spiking neuron 400 (also known as an integrate-and-fire neuron) uses a capacitor C to perform the function of integrating (i.e. accumulating) current $I_{sense}$ flowing into the neuron as a voltage. That is, capacitor C accumulates and stores the current flowing into the neuron. The current flowing into a neuron is also known as a synaptic current. The spiking neurons 400 typically comprise a comparator which compares the stored voltage in capacitor C to a threshold voltage. If the stored, accumulated voltage is equal to or greater than the threshold voltage, the comparator outputs a spike or a pulse. This is known as 'firing'. After firing, the capacitor C is discharged in order to reset the neuron 400. If the stored, accumulated voltage is below the threshold voltage, the comparator does not output a spike/pulse. However, the capacitor C required for this hardware spiking neuron 400 typically has a capacitance between 100 fF (femtofarad) to a few picofarads, which therefore consume a lot of area on an integrated circuit. For example, a capacitor with a capacitance of 100 fF may take up an area of at least 10 µm by 10 µm (i.e. 100 µm²), which is a significant portion of an integrated circuit. Capacitors are also prone to leakage, making neuron 400 unreliable.

The present techniques provide a neuron circuit that exploits the property of correlated electron materials (CEMs) to be set into multiple low impedance states depending on the compliance current applied to the CEM. The neuron circuit of the present techniques comprises a CES element (which comprises a CEM) for storing a threshold current value as a compliance current. Accordingly, the membrane potential of the neuron circuit (which needs to be reached or exceeded for the neuron circuit to output a spike) may be set to a wide range of values simply by applying different compliance currents to the CES element.

The neuron circuit of the present techniques may, in embodiments, comprise a further CES element to accumulate/integrate incoming current $I_{sense}$, thereby removing the need for a capacitor (which is prone to leakage and occupies a large area on an integrated circuit). The further CES element stores the accumulated current as a compliance current. That is, the CES element is set to a different impedance state based on the compliance current, which is in turn based on the accumulated current. The compliance current of CES elements is now described in more detail.

Figure 5:
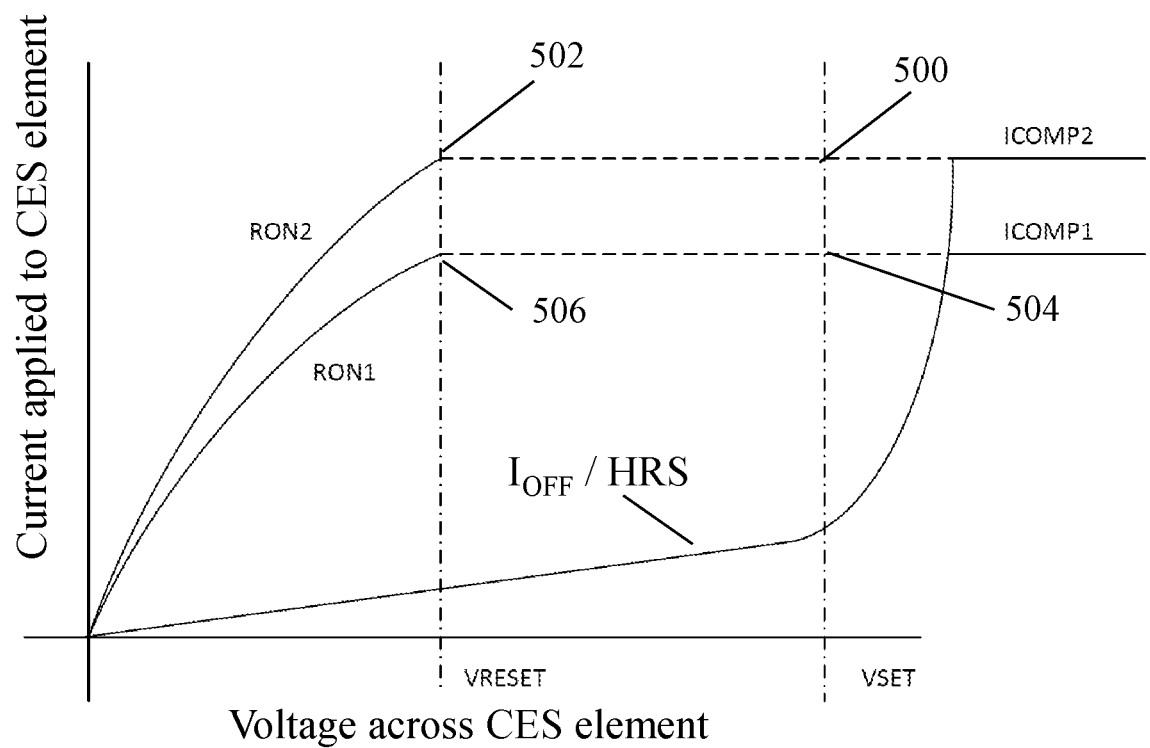
FIG. 5 is a schematic diagram of using compliance current to adjust a low resistance value of a correlated electron device.

FIG. 5 is a schematic diagram showing how compliance current may be used to adjust a low impedance value of a CES element. (As mentioned above, 'impedance' may correspond to resistance, capacitance or a combination of resistance and capacitance of the CES element). Transitioning a CES element from a conductive/lower impedance state to an insulative/higher impedance state (i.e. a reset condition) or from an insulative/higher impedance state to a conductive/lower impedance state (i.e. a set condition) may require a current to flow through the CES element which is sufficient to cause a Mott or Mott-like transition to occur in the correlated electron material (CEM) of the CES element at a specific voltage. As shown in FIG. 1, to achieve a reset condition to cause a transition from a conductive/lower impedance state to an insulative/higher impedance state, a voltage $V_{reset}$ may be applied across a CES element, and a current density $J_{reset}$ may be achieved in the CES element. Both the voltage and current conditions need to be met, in an embodiment, before a reset condition can be achieved resulting in a transition from a conductive/lower impedance state to an insulative/higher impedance state. Similarly, as also shown in FIG. 1, to achieve a set condition to cause a transition from an insulative/higher impedance state to a conductive/lower impedance state, a voltage $V_{set}$ may be applied across a CES element, and a current density $J_{set}$ may be achieved in the CES element.

Turning back to FIG. 5, application of different compliance currents to a CES element may enable the low impedance state of the CES element to be adjusted. For example, by increasing a voltage V across the CES element from $V_{reset}$ up to $V_{set}$, and by applying a particular compliance current to the CES element, the set condition may be achieved such that the CES element transitions in a particular low impedance state. Varying the compliance current applied to the CES element may enable the CES element to be set into a particular low impedance state.

Current in a CES element may be controlled by an externally applied "compliance" condition determined, at least in part, on the external current limited during a write operation to achieve a set condition to place the CES device in a conductive/lower impedance state. This externally applied compliance current also sets the subsequent reset condition current density requirement. FIG. 5 shows the I-V characteristics of a CES element (which comprises a correlated electron material, CEM). The CES element has a high impedance state (or high resistance state, HRS/$I_{OFF}$), and one or more low impedance states ($I_{ON}$). The CES element transitions from $I_{ON}$ to $I_{OFF}$ when the voltage applied across the CES element reaches $V_{RESET}$. The state of the CES element may be set to a low impedance state once the voltage across the CES element reaches $V_{SET}$. The CES element may be set to multiple low impedance states (or ION values), depending on the compliance current applied to the CES element. In FIG. 5, two different compliance currents are shown ($I_{COMP1}$ and $I_{COMP2}$) which result in $I_{ON1}$ (at point 506) and $I_{ON2}$ (at point 502), and associated resistances of $R_{ON1}$ and $R_{ON2}$.

As shown in the particular implementation of FIG. 5, a current density $I_{COMP2}$ applied during a write operation at point 500 to place the CES element in a conductive/lower impedance state may provide a current Ion at point 502 given by:

$$Ion = Icomp2.C(\exp(V)).\sqrt{V} \quad \text{(Equation 1)}$$

It will be understood that a low impedance state can be modified by setting the compliance current, because the current Ion in the low impedance state varies inversely with the compliance current. Therefore, a current density $I_{COMP1}$ at point 504 may provide an Ion value at 506 which is lower than that provided by $I_{COMP2}$ at point 500. In the present techniques, this property of correlated electron materials is exploited to enable CES elements (which comprise CEMs) to be used to (a) accumulate/integrate current and/or (b) store a threshold current value. Thus, CES elements may be used to perform the 'integrate' part of an integrate-and-fire neuron, and/or to perform (or be used as part of) the 'fire' part of an integrate-and-fire neuron.

A compliance current, such as an externally applied compliance current, therefore may set a number of electrons in a CEM of a CES element which are to be "captured" by holes for the Mott transition. In other words, a current applied during a write operation to place a CES element in a conductive/lower impedance state may determine a number of holes to be injected to the CEM of the CES element for subsequently transitioning the CES element to an insulative/higher impedance state.

Generally speaking, the compliance current of a CES element may be set via an external circuit which may provide a programmable/variable current. The compliance current of a CES element may vary by an order of magnitude, two orders of magnitude, or more, such that the low impedance states ($R_{ON1}$, $R_{ON2}$, etc.) may be clearly distinguishable or distinct. This property of CES elements may be used, in embodiments, to provide a small-area integrator circuit for accumulating current flowing into an integrate-and-fire neuron. This property of CES elements may be used, in embodiments, to provide a means to store a threshold value (i.e. the 'membrane potential' of the neuron). Embodiments also provide a threshold detector comprising a CES element which determines if the accumulated current has reached or exceeded the threshold value, and which may cause the neuron to fire (i.e. output a spike).

Figure 6:
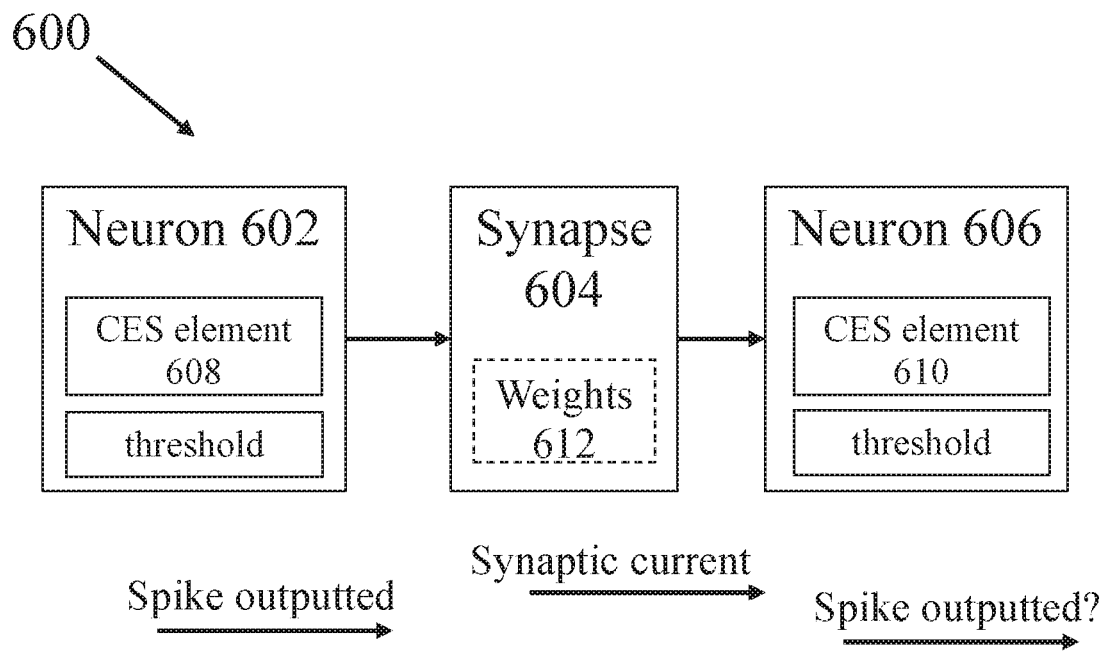
FIG. 6 is a block diagram of a portion of a hardware-based spiking neural network comprising neurons for outputting spikes in response to synaptic current.

FIG. 6 is a block diagram of a portion 600 of a hardware-based spiking neural network comprising neurons for outputting spikes in response to synaptic current. The spiking neural network may be formed of, or comprise, a plurality of neurons. The plurality of neurons may be arranged in an array, in a linear structure, in a tree (branching) structure, or in any other configuration. All, or a subset, of the plurality of neurons of the spiking neural network are spiking neurons. A spiking neuron, as explained earlier, sums inputs into the spiking neuron and outputs a spike (or spike signal) when the summed inputs reach or exceed a threshold value associated with the spiking neuron. Broadly speaking, for hardware-based spiking neurons, the threshold value may be a threshold voltage, a threshold current, a threshold charge, etc. The inputs into the spiking neuron may correspond to the threshold type. For example, if the spiking neuron has a threshold current, the inputs into the spiking neuron are currents, and the output make be a sharp change in current as may be represented by a delta function, for example. However, in embodiments, the inputs into the spiking neuron do not need to match the output spikes—for instance, the inputs may be currents but the spiking neuron may output a voltage spike.

In embodiments, the spiking neurons in a spiking neural network all have the same type of threshold value, i.e. voltage or current. The magnitude of the threshold value may vary between the spiking neurons in the spiking neural network, or may be the same for all spiking neurons. For example, in a spiking neural network, some of the spiking neurons may have a threshold voltage of 5V, while other spiking neurons may have a threshold voltage of 8V, and other spiking neurons may have a threshold voltage of 2V. The magnitude of the threshold value for each spiking neuron within a spiking neural network may be application-dependent. (That is, the magnitudes of the threshold values may depend upon what the spiking neural network is being used for, or what algorithm the spiking neural network is implementing). For a hardware-based spiking neural network, the magnitudes of the threshold values for each spiking neuron may be determined by performing simulations or training offline, i.e. external to the hardware-based neural network itself. Once determined, the threshold values are applied to each spiking neuron—this process will be described in more detail below.

The illustrated portion 600 of the spiking neural network comprises a first neuron 602 and a second neuron 606. The first neuron 602 and second neuron 606 may be spiking neurons configured to output spikes as described above. The first neuron 602 and the second neuron 606 are each associated with a threshold value, which may be the same for each neuron or may be different. Each neuron 602, 606 is configured to receive inputs (e.g. from other neurons or from external stimuli), accumulate the received inputs (e.g. sum together current inputs), and to output a spike when the accumulated inputs reach or exceed the threshold value of the neuron. The spike outputted by a neuron (e.g. neuron 602) may be received by another neuron (e.g. neuron 606) within the spiking neural network, or may be received by some other component of the spiking neural network. The first neuron 602 comprises at least one correlated electron switch (CES) element 608, and the second neuron 606 comprises at least one CES element 610. The CES elements 608, 610 may be used by the neurons 602, 608 respectively, to determine whether or not a spike is to be fired. This is described in more detail below (e.g. with respect to FIGS. 11, 14, 15 and 18). In embodiments, the neurons 602, 606 may comprise additional CES elements for integrating/accumulating inputs into the neurons. This is described in more detail below (e.g. with respect to FIGS. 8 and 9).

As shown in FIG. 6, a synapse 604 is provided between the first neuron 602 and the second neuron 606, and functions to couple together the neurons such that signals may be transmitted between the neurons 602, 606. In a hardware-based spiking neural network, the neurons 602, 606 comprise electrical components and are configured to receive electrical signals and output electrical signals (i.e. spikes or signals resembling a delta function). For example, the neurons 602, 606 may receive currents or voltages as inputs, and may be configured to output current spikes or voltage spikes. The synapse 604 may be a wire or other conductive channel or conductive means to enable the electrical signals to pass between the neurons 602, 606. For example, the synapse 604 may enable a synaptic current to flow between neurons 602, 606, where the synaptic current is based on (dependent on, or resultant from) the spike outputted by of the neurons. In embodiments, signals may flow in one direction only across the synapse 604. That is, neuron 602 may output a spike which is received by neuron 606 (via synapse 604). In alternative embodiments, signals may flow in both directions across the synapse 604, such that neuron 602 may receive spikes output by neuron 606, and neuron 606 may receive spikes output by neuron 602.

In embodiments, the synapse 604 may optionally comprise weights 612, or implement weighting functions, such that spikes outputted by one neuron are weighted by the synapse 604 before being sent as inputs into another neuron. The synaptic weights 612 may be adjustable, such that information which flows through the spiking neural network may be altered. For example, the synaptic weights 612 may be used to alter the strength or magnitude of signals outputted by one neuron before the signals are received as inputs by another neuron. This may be useful if the magnitude of the spike signals outputted by one neuron would cause a receiving neuron to spike immediately. Thus, for example, a synaptic current outputted by synapse 604 may not be equal in magnitude to a current spike outputted by neuron 602. The values of the synaptic weights 612 may be determined by performing the neural network training offline, i.e. external to the hardware-based neural network itself. The synaptic weights 612 may be applied by using resistive elements or other suitable components for adjusting the strength of the signals received by the synapse 604. Accordingly, the values of the synaptic weights 612 may be implemented in the synapse 604 by selecting suitable components, or by programming programmable resistive elements. This is described below with respect to FIGS. 7 and 16.

Figure 7:
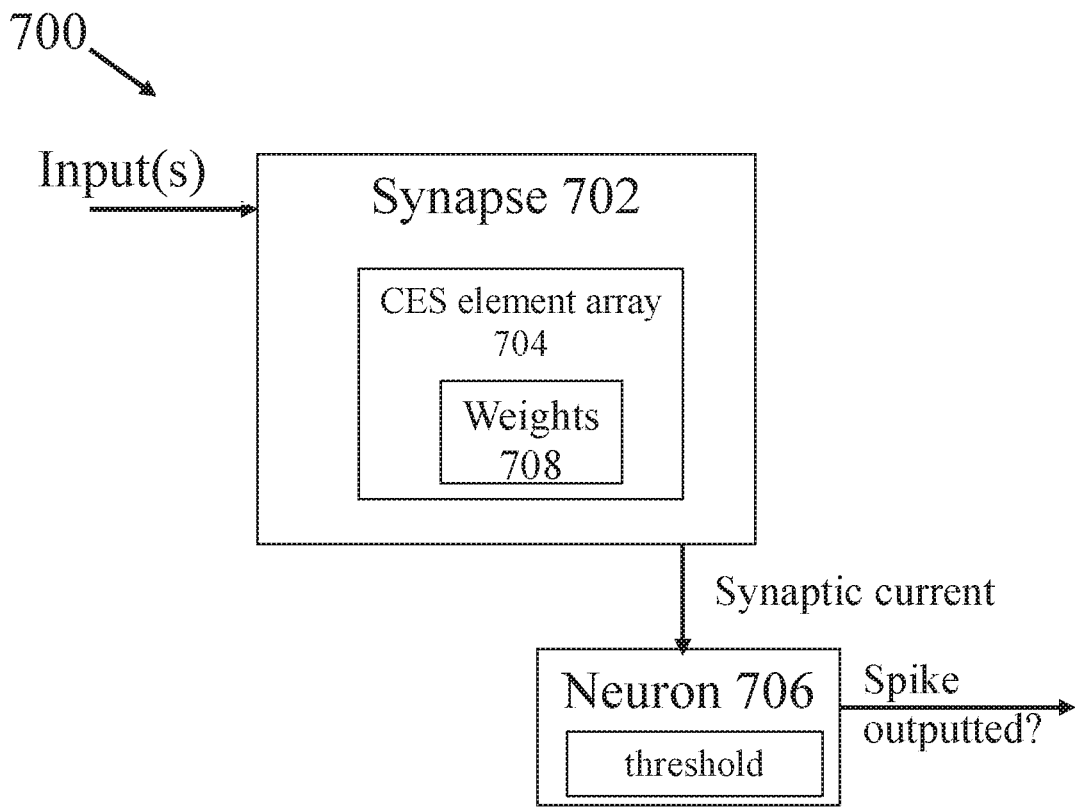
FIG. 7 is a block diagram of a portion of a hardware-based spiking neural network comprising synapses and neurons for outputting spikes in response to synaptic current.

FIG. 7 is a block diagram of a portion 700 of a hardware-based spiking neural network comprising synapses and neurons for outputting spikes in response to synaptic current. The portion 700 of the spiking neural network comprises a synapse 702 coupled to a neuron 706. The neuron 706 may be a spiking neuron. The synapse 702 receives one or more inputs from, for example, other neurons or from sources external to the spiking neural network. The synapse 702 outputs a synaptic signal (e.g. a synaptic current, a synaptic voltage, etc.), which may be received by neuron 706 as an input signal. The neuron 706 comprises a threshold value, as described above, such that when the inputs into the neuron 706 reach or exceed the threshold value, the neuron 706 outputs a spike.

The synapse 702 may comprise an array of resistive elements which provides a conductance matrix, i.e. a means to weight input signals and provide a weighted output. The array may be an array of memristor or resistive RAM (ReRAM) elements. Preferably, the synapse 702 comprises an array of CES elements 704, which implements the synaptic weights 708 of the synapse. The CES element array 704 may be a crosspoint array. The crosspoint array 704 may be used to sum the dot-product computation of weights 708 and input signals, and output a signal (e.g. a synaptic current) as an input into neuron 706. The crosspoint array 704 may be an array of 'n' rows and 'm' columns, where n and m are integers, and where n and m may be equal or different. Thus, the crosspoint array 704 may be an n×m dimensional crosspoint array. A CES element is provided at each intersection of a row and a column. Each CES element of the CES element crosspoint array 704 may be programmed into a particular impedance state in order to implement the weights 708 into the array 704. In embodiments, the CES elements in array 704 may be used as digital weighting elements such that they are either in a high impedance state (0) or in a low impedance state (1). In embodiments, the CES elements in array 704 may be used as 'analogue' weighting elements, such that they are either in a high impedance state or in one of a plurality of low impedance states. As explained earlier, by varying the compliance current applied to a CES element, the CES element may be set into a particular low impedance state. The technique of using compliance current to implement a CES element crosspoint array for a synapse is explained in more detail below with respect to FIGS. 16, 17 and 18.

Figure 8:
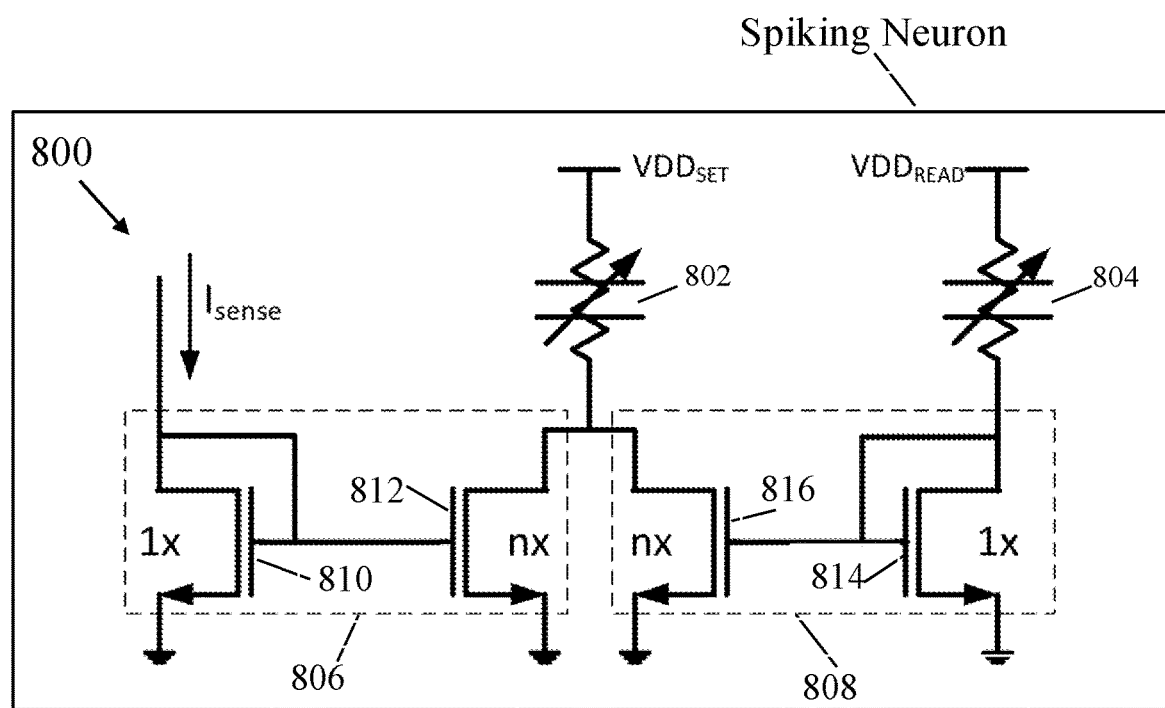
FIG. 8 is an example circuit diagram of a part of a neuron circuit for sensing and integrating incoming synaptic currents.

As shown in FIG. 6, a spiking neuron of a spiking neural network may comprise a threshold value and may comprise at least one CES element that is used to determine whether or not the neuron should output a spike. (The term 'output a spike' is also referred to herein as 'firing' and 'firing a spike'). As mentioned above, a spiking neuron may comprise one or more additional CES elements for integrating/accumulating input signals into the neuron. An advantage of using one or more CES elements to perform the integration/accumulation function is that they remove the need to use a capacitor for this function. Capacitors are prone to leakage and occupy a large area on a circuit board relative to CES elements. Turning now to FIG. 8, this shows an example circuit diagram of a circuit 800 for sensing and integrating synaptic currents $I_{sense}$ that are received by a spiking neuron. Circuit 800 uses CES elements to integrate/sum/accumulate the synaptic currents that are input into a spiking neuron. Thus, the sensing and integrating circuit 800 may form part of a spiking neuron of a hardware-based spiking neural network. That is, each neuron in a spiking neural network may comprise the sensing and integrating circuit 800. As explained earlier with reference to FIG. 4, the capacitors used to integrate current $I_{sense}$ in some integrate-and-fire neurons consume a large area on a chip. In contrast, the circuit 800 for integrating incoming synaptic currents comprises a first CES element 802 and a second CES element 804. Each CES element 802, 804 comprises a correlated electron material (CEM). The first CES element 802 is used to accumulate/integrate the incoming synaptic current $I_{sense}$ with any current already accumulated within the circuit 800. The second CES element 804 stores any current already accumulated within the circuit 800. When circuit 800 is used for the first time (or when the circuit 800 is used after the neuron in which the circuit 800 is located has outputted a spike), the second CES element 804 will be in a 'reset' phase/mode, i.e. in a high impedance state ($I_{OFF}$), such that current through the second CES element 804 will be substantially zero.

The circuit 800 comprises a first current mirror 806 (indicated by the dashed box) and a second current mirror 808. The first current mirror 806 is configured to mirror incoming current $I_{sense}$ to the first CES element 802, so that the first CES element 802 may integrate the incoming current with any current already accumulated in circuit 800 (i.e. in second CES element 804). The first current mirror 806 comprises a first transistor 810 and a second transistor 812. The base and collector (or gate and drain in the case of a MOS transistor) of the first transistor 810 are connected together. The emitter (or source of a MOS transistor) of the first transistor 810 and the emitter (or source) of the second transistor 812 are connected together. Consequently, the gate source junction of the first transistor 810 acts as a diode, and a current builds up across this junction. If the gate connections of both the first transistor 810 and the second transistor 812 are connected/linked, or if the voltage across the gate source junction of both transistors 810, 812 is the same, then the current in the first transistor 810 will be the same as the current in the second transistor 812 (assuming the transistors are substantially matched). Thus, the incoming synaptic current $I_{sense}$ is mirrored to the second transistor 812, such that the incoming synaptic current $I_{sense}$ flows into the first CES element 802.

The second current mirror 808 is configured to mirror any accumulated current in the circuit 800 (i.e. in second CES element 804) into the first CES element 802, so that the first CES element 802 may integrate the accumulated current with an incoming synaptic current $I_{sense}$. The second current mirror 808 comprises a first transistor 814 and a second transistor 816. The base and collector (or gate and drain) of the first transistor 814 are connected together. The emitter (or source) of the first transistor 814 and the emitter (or source) of the second transistor 816 are connected together. Consequently, the gate source junction of the first transistor 814 acts as a diode, and a current builds up across this junction. If the gate connections of both the first transistor 814 and the second transistor 816 are connected/linked, or if the voltage across the gate source junction of both transistors 814, 816 is the same, then the current in the first transistor 814 will be the same as the current in the second transistor 816 (assuming the transistors are substantially matched). Thus, the accumulated current in the second CES element 804 (which flows into first transistor 814) is mirrored to the second transistor 816, such that the accumulated current flows into the first CES element 802. When the circuit 800 is used for the first time, or when the circuit 800 is used after a firing event, the second CES element 804 is in the high impedance state and the current through the CES element 804 (and through this branch of the circuit 800) will be substantially zero. Accordingly, a negligible current will be mirrored to second transistor 816.

Thus, the current mirrors 806, 808 provide two input currents to the first CES element 802, and the first CES element 802 integrates (i.e. adds together) the two input currents. The two input currents form a compliance current which is used to set/program the first CES element 802 into a corresponding low impedance state. The voltage across the first CES element 802 is set to Vset, so that when the compliance current is applied to the first CES element 802, the first CES element 802 is set into a corresponding low impedance state. In this way, the first CES element 802 integrates current flowing into circuit 800 and stores the current as a compliance current (by switching into a particular low impedance state).

Figure 9:
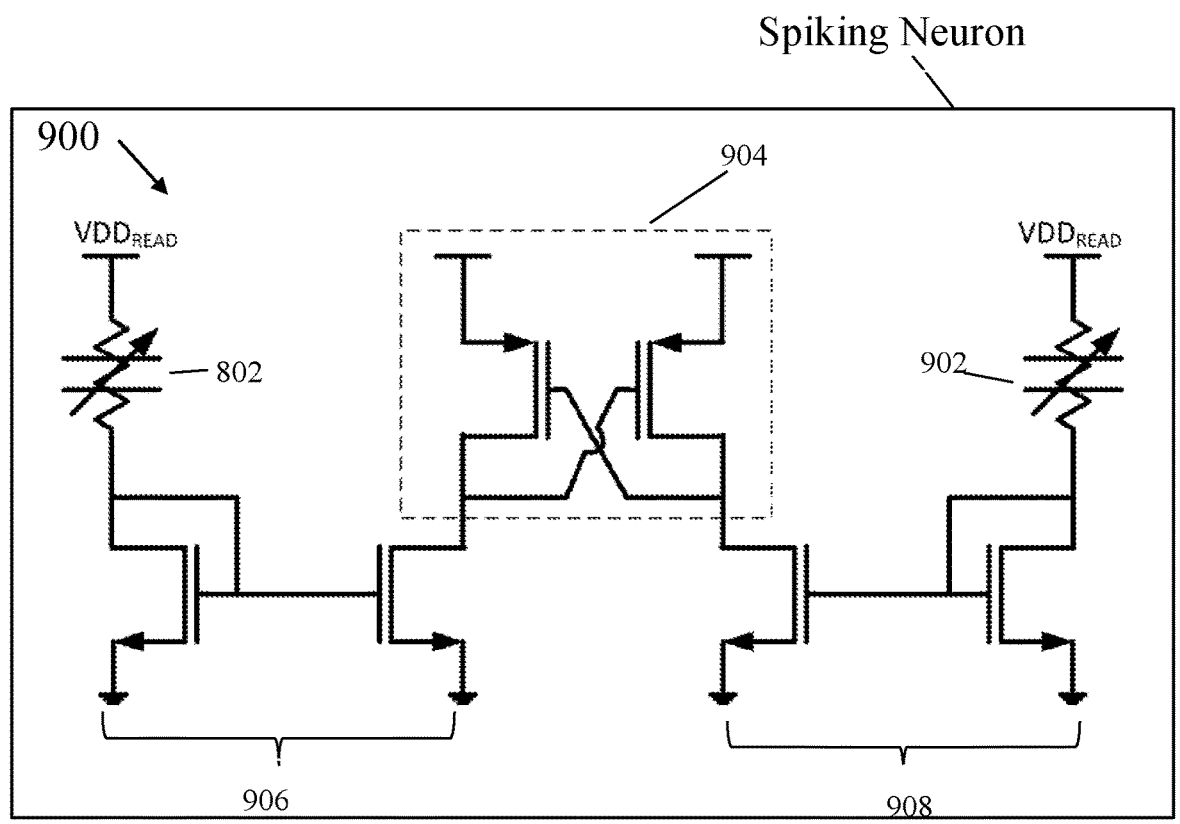
FIG. 9 is an example circuit diagram of a part of a neuron circuit for outputting a spike.

The integrated current stored by the first CES element 802 is compared with a threshold current (associated with the neuron in which circuit 800 is located), to determine whether or not the neuron is to fire/output a spike. FIG. 9 is an example circuit diagram of a comparator circuit 900, which may fire a spike based on the outcome of the comparison. The comparator circuit 900 is part of the neuron in which circuit 800 is located. Thus, each spiking neuron of a spiking neural network may comprise both circuit 800 and circuit 900.

The comparator circuit 900 comprises the first CES element 802 described above. Accordingly, the comparator circuit 900 may be formed by coupling circuitry to the first CES element 802 of circuit 800, e.g. after a synaptic current has been sensed by circuit 800. The comparator circuit 900 comprises a third CES element 902, which is configured to store a threshold current of the neuron. The third CES element 902 is programmed to store a specific threshold current. The application of a particular compliance current and voltage Vset to the third CES element 902 causes the third CES element to be set into a particular low impedance state, which thereby enables the third CES element to store a threshold current. That is, the threshold current stored by the third CES element 902 corresponds to the compliance current used to set the low impedance state of the third CES element 902. The value of the threshold current/compliance current may be determined by training a neural network offline, i.e. remote from the hardware-based spiking neural network itself, such as in a cloud or remote server.

The comparator circuit 900 comprises a comparator 904 configured to compare the integrated current stored by the first CES element 802 and the threshold current stored by the third CES element 902. The comparator circuit 900 comprises a first mirror circuit 906 and a second mirror circuit 908. The first mirror circuit 906 mirrors the integrated current stored by the first CES element 802 into the comparator 904, and the second mirror circuit 908 mirrors the threshold current stored by the second CES element 902 into the comparator 904. The comparator 904 compares the integrated current and the threshold current. As a spiking neuron has a binary output (i.e. on/off, I/0, spike/no-spike), if the integrated current is less than the threshold current, the comparator 904 may not output a signal, or may output a signal indicating a zero (0), while if the integrated current is greater than or equal to the threshold current, the comparator 904 may output a signal indicating a one (1). Thus, comparator 904 outputs a spike (i.e. fires) when the integrated current reaches or exceeds the threshold current. The spike may be a sharp, sudden increase in current, for example.

If the comparator 904 outputs a spike, because the integrated current has reached or exceed the threshold current, the first CES element 802 is reset. In other words, the first CES element 802 is programmed into a 'reset' phase/mode, i.e. into a high impedance state ($I_{OFF}$), such that current in the first CES element 802 will be substantially zero. The first CES element 802 can now be used to accumulate/integrate incoming current again. Similarly, the second CES element 804 is 'reset' into a high impedance state ($I_{OFF}$), such that current in the second CES element 804 will be substantially zero. The second CES element 802 can now be used to store accumulated current.

If the comparator 904 does not output a spike, because the integrated current stored by the first CES element is below the threshold current stored by second CES element 902, the integrated current stored by the first CES element 802 is sent to second CES element 804 for storage. This may be achieved by swapping the first CES element 802 and second CES element 804 using pass gate switches. (The pass gate switches are described in more detail with reference to FIG. 10B below). That is, the accumulated current is now stored by the second CES element 804, such that the present accumulated current becomes the previously accumulated current for the next cycle of operation of the sensing and integrating circuit 800. The first CES element 802 is reset/programmed into a 'reset' phase/mode, i.e. into a high impedance state ($I_{OFF}$), such that current in the first CES element 802 will be substantially zero. The first CES element 802 can now be used to accumulate/integrate incoming current with any stored accumulated current again.

As mentioned earlier, the state of a CES element is read at a lower voltage ($VDD_{READ}$ or $V_{read}$) than voltages used to reset ($V_{reset}$) and set ($VDD_{SET}$ or $V_{set}$) the CES element. (See also FIG. 1 and accompanying description). Accordingly, when the integrated current stored by the second CES element 804 is provided to the first CES element 802 during an integration/summation operation, the second CES element 804 is read at a lower voltage than voltage $V_{set}$ used to store the current in the second CES element 804. This means the current supplied to the first CES element 802 during an integration operation may not be equal to the current stored by the second CES element 804. Accordingly, the current mirror 808 may apply a ratio of 1x:nx when mirroring the stored current in the second CES element 804, to compensate for the different voltages used when reading, setting and resetting. That is, the stored current in the second CES element 804 may be multiplied by n when the current mirror 808 mirrors the stored current. Multiplier n may be related to a characteristic or a property of the CES elements themselves, to account for any manufacturing/processing effects that cause the real $V_{read}$, $V_{reset}$, and/or $V_{set}$ voltages to differ from expected/target $V_{read}$, $V_{reset}$, and/or $V_{set}$ voltages.

The example circuits 800 and 900 of a spiking neuron are merely illustrative examples of how to use CES elements to store threshold currents and to sense and integrate incoming synaptic currents. An advantage of these example circuits is that the combination of the circuits 800 and 900 consumes much less area than a single capacitor. For example, a capacitor with a capacitance of 100 fF may take up an area of at least 10 µm by 10 µm (i.e. 100 µm$^2$), which is a significant portion of a circuit board/chip, whereas the total area of circuits 800 and 900 is 5 µm$^2$. Accordingly, circuits 800 and 900 provide a compact way to implement a spiking neuron in hardware, which is also scalable.

Figure 10A:
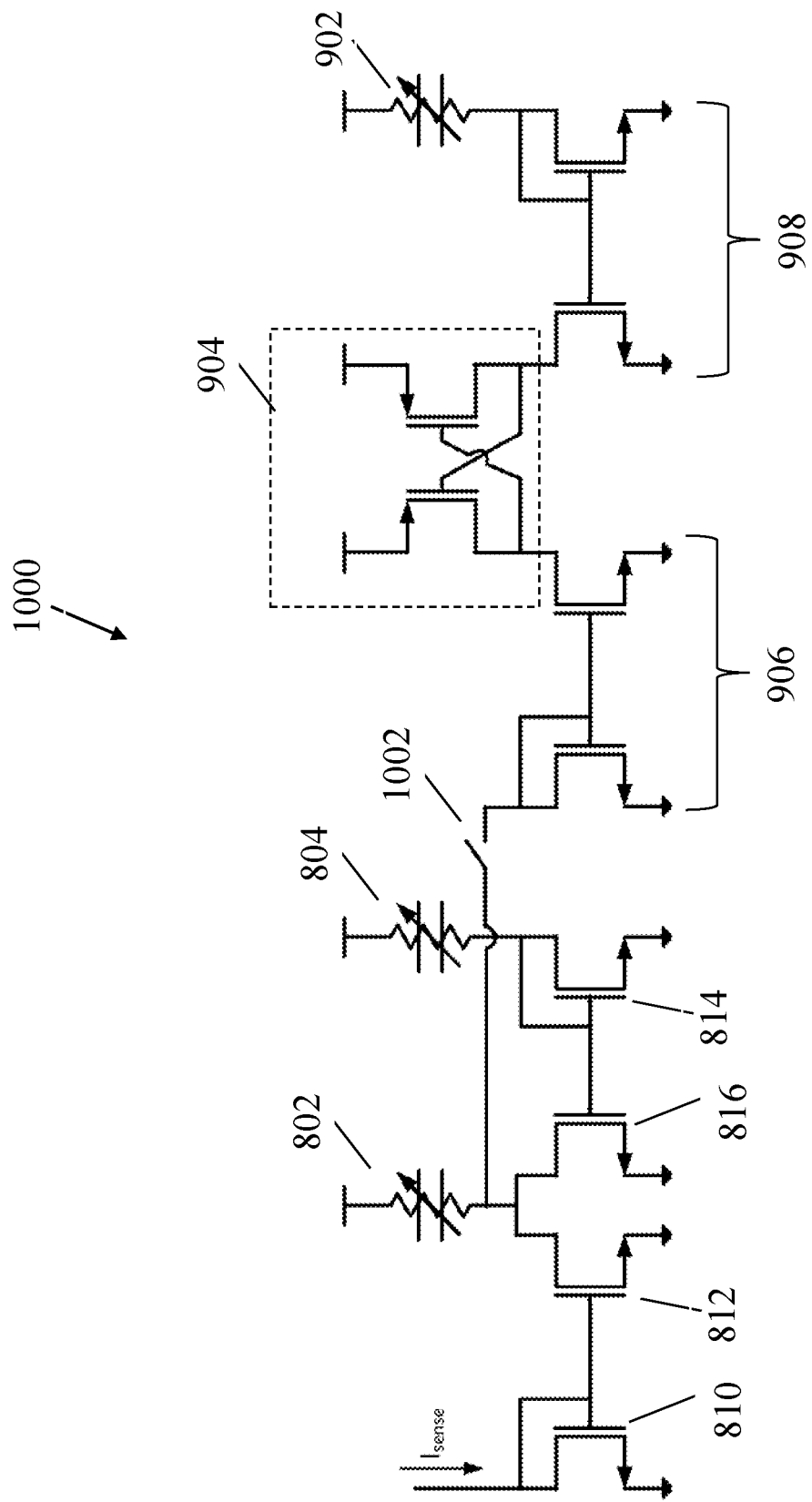
FIGS. 10A and 10B show example circuit diagrams of neuron circuits for integrating incoming synaptic currents and outputting a spike.

FIG. 10A is an example circuit diagram of a neuron circuit for integrating incoming synaptic currents and outputting a spike. The neuron circuit 1000 comprises sensing and integrating circuit 800 and comparator circuit 900, and accordingly, like reference numerals refer to the same or similar elements. Switch 1002 couples circuit 800 to circuit 900, such that the integrated current stored by CES element 802 may be input into the comparator circuit 900. Specifically, switch 1002 enables the integrated current stored by CES element 802 to be mirrored into the first mirror circuit 906 of the comparator circuit 900. The second mirror circuit 908 mirrors the threshold current stored by the second CES element 902 into the comparator 904. The comparator 904 compares the integrated current and the threshold current, as previously described.

Figure 10B:
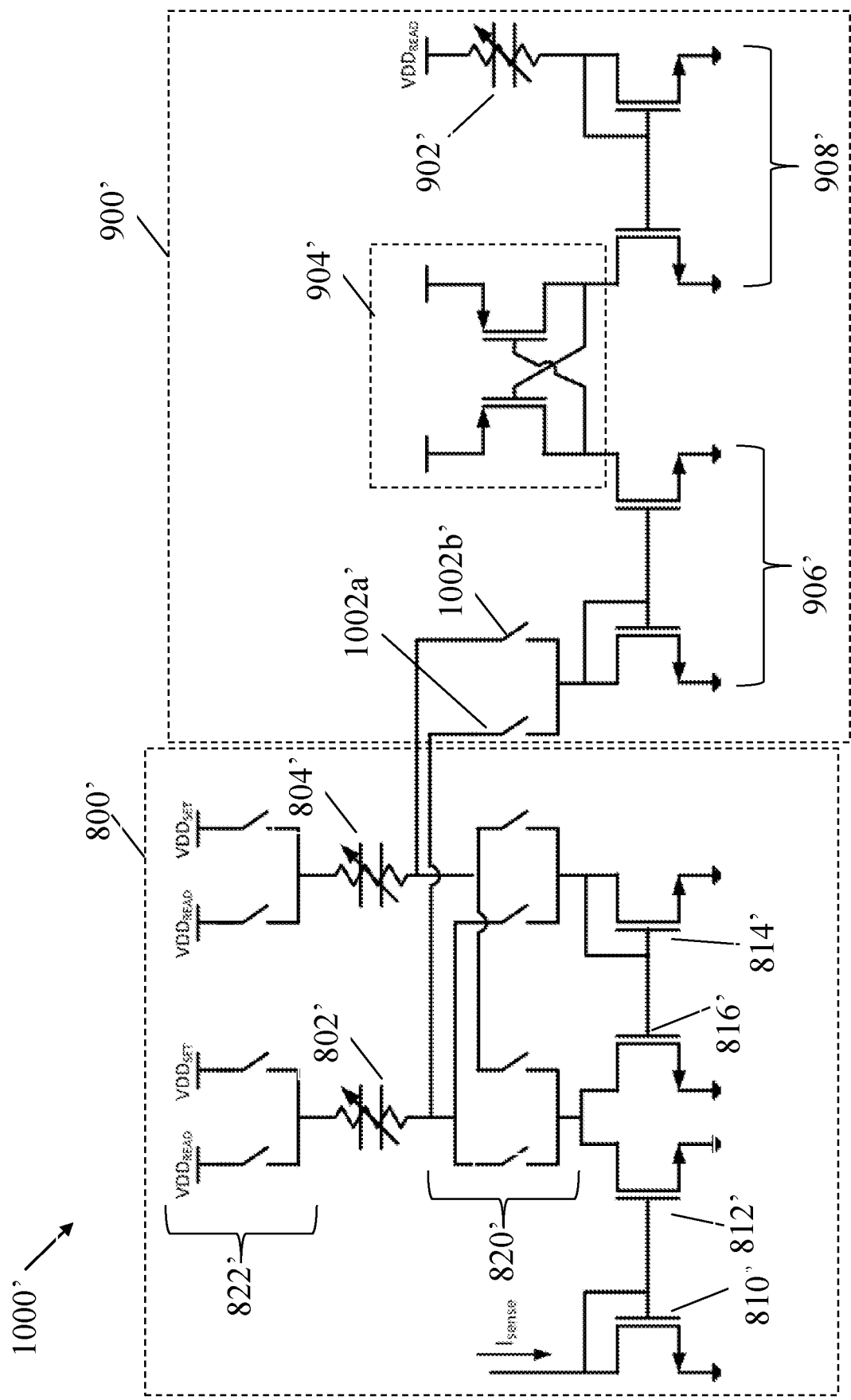

FIG. 10B is another example circuit diagram of a neuron circuit 1000' for integrating incoming synaptic currents and outputting a spike. The neuron circuit 1000' comprises sensing and integrating circuit 800' and comparator circuit 900'. Circuits 800' and 900' respectively perform similar functions to circuits 800 and 900, but differ in their arrangement/layout. Like reference numerals refer to the same or similar elements. Circuit 800' uses CES elements to integrate/sum/accumulate the synaptic currents that are input into the spiking neuron 1000'. Circuit 800' a first CES element 802' and a second CES element 804'. Each CES element 802', 804' comprises a correlated electron material (CEM). The first CES element 802' is used to accumulate/integrate the incoming synaptic current $I_{sense}$ with any current already accumulated within the circuit 800'. The second CES element 804' stores any current already accumulated within the circuit 800'. Circuit 800' differs from circuit 800 in that the first CES element 802' and second CES element 804' can both be used to integrate incoming synaptic current with accumulated current, and to store accumulated current. Switches 820' may be used to couple the first CES element 802' to the mirror circuitry so that the first CES element 802' may be used to perform the accumulation/integration function, or switches 820' may be used to couple the second CES element 804' to the mirror circuitry so that the second CES element 804' may perform the accumulation/integration function. Switches 822' enable the correct voltage to be applied to the CES elements 802', 804' depending on which function the CES elements are performing (i.e. integration, or storage). That is, if the first CES element 802' is being used to integrate input currents, and the second CES element 804' is used to store accumulated current, then switches 822' are used to apply Vset across the first CES element 802' and Vread to the second CES element 804'. Similarly, if the second CES element 804' is being used to integrate input currents, and the first CES element 802' is used to store accumulated current, then switches 822' are used to apply Vset across the second CES element 804' and Vread to the first CES element 802'.

Switches 1002a' and 1002b' are used to couple circuit 800' to the comparator circuit 900' depending on which of the first CES element 802' and second CES element 804' is used to integrate the incoming synaptic current with the stored current. For example, if CES element 802' performed the integration, switch 1002a' is closed to enable the integrated current to be input into the comparator circuit 900'. In this example, if the comparator 904' does not output a spike, because the integrated current provided by CES element 802' is below the threshold current stored by CES element 902', the integrated current stored by the first CES element 802' is sent to second CES element 804' for storage. This may be achieved by swapping the roles of the first CES element 802' and second CES element 804' using pass gate switches 820'. That is, in the next cycle of operation, CES element 802' may be used to store the previously accumulated current (i.e. the current it integrated in the previous cycle), and CES element 804' may be used to perform the integration function. In other words, in a first cycle, CES element 802' performs the integration function, and then by using the pass gate switches 820', in the subsequent cycle, CES element 804' performs the integration function. The CES element which performs the integration function is coupled, via one of switch 1002a' and switch 1002b', to the comparator circuit 900'.

Figure 11:
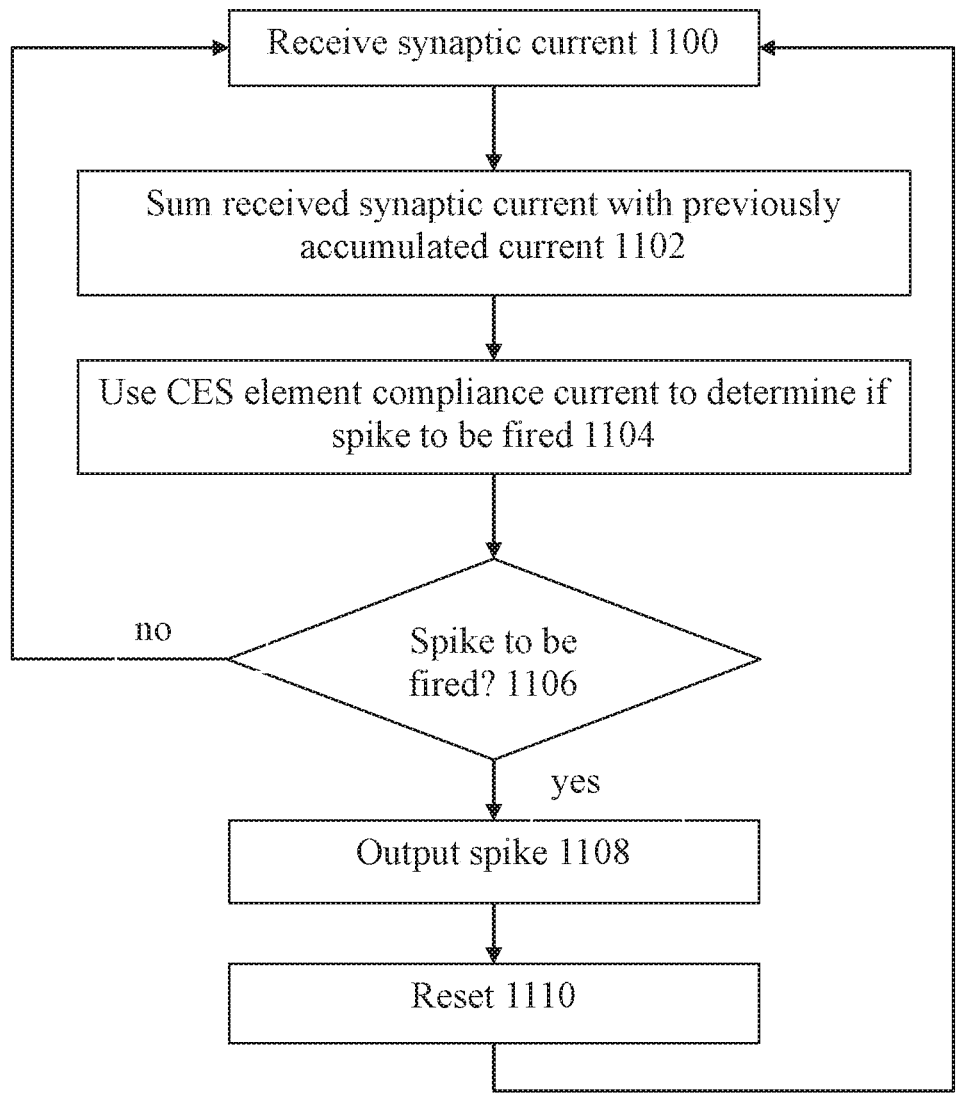
FIG. 11 is a flow diagram showing the general operation steps of a neuron circuit comprising a CES element.

FIG. 11 is a flow diagram showing the general operation steps of a spiking neuron comprising a CES element, such as neuron 606 shown in FIG. 6. The spiking neuron comprises a threshold value and comprises at least one CES element that is used to determine whether or not the neuron should output a spike. (The spiking neuron may comprise one or more additional CES elements for integrating/accumulating input signals into the neuron).

The process of FIG. 11 begins when the spiking neuron receives a synaptic current (or other synaptic signal from a synapse) as an input into the spiking neuron (step 1100). The spiking neuron adds/sums the received synaptic current with any previously accumulated current stored in the spiking neuron (step 1102). If the synaptic current received at step 1100 is received immediately after the spiking neuron has outputted a spike, then there will not be any previously accumulated current to add to the received synaptic current (as the spiking neuron is reset after outputting a spike/firing). One example technique for summing the received synaptic current with any previously accumulated current is described above with respect to FIGS. 8 and 9. Other example techniques for summing received synaptic signals with previously accumulated signals are described below with respect to FIGS. 13, 14 and 15.

Once the received synaptic current has been added to any previously accumulated current, the spiking neuron uses a compliance current of the at least one CES element to determine if a spike is to be outputted (step 1104). There are a variety of ways in which the spiking neuron may use the compliance current of the CES element to determine whether or not to fire a spike.

For example, in embodiments, the at least one CES element may store a threshold value for the spiking neuron as a compliance current. In this case, at step 1104, the summed current (i.e. accumulated current) is compared to the compliance current of the CES element to determine if the threshold value has been reached or exceeded. Thus, at step 1106, the spiking neuron uses the comparison to determine if a spike is to be fired. As mentioned earlier, if the summed current is greater than or equal to the threshold value, then the spiking neuron outputs a spike (step 1108). If the summed current is less than the threshold value, the spiking neuron does not output a spike, and returns to step 1100 to await further input signals. (The summed current is stored to be added to the next input signal). If a spike is outputted by the spiking neuron, the spiking neuron is reset (step 1110) so that the spiking neuron is ready for the next cycle of integrating inputs and outputting a spike. In this example, the spiking neuron may be reset by removing any stored accumulated current.

In other example embodiments, a compliance current may be used to set the at least one CES element into a particular low impedance state. Once the CES element has been set into a low impedance state, the voltage across the CES element may be reduced to below $V_{reset}$. The summed synaptic currents may cause a voltage across the CES element to increase, and when the voltage across the CES element reaches/exceeds $V_{reset}$, the CES element may reset and switch into a high impedance state (step 1104). At step 1106, the spiking neuron may determine whether or not the state of the CES element has changed to determine if a spike is to be fired. If the CES element has switched into a high impedance state, the spiking neuron outputs a spike (step 1108). If the CES element has not switched into a high impedance state, the spiking neuron does not output a spike, and returns to step 1100 to await further input signals. If a spike is outputted by the spiking neuron, the spiking neuron is reset (step 1110) so that the spiking neuron is ready for the next cycle of integrating inputs and outputting a spike. In this example, the spiking neuron may be reset by removing any stored accumulated current, and by applying the compliance current (and voltage $V_{set}$) to the at least one CES element to switch the CES element back into the associated low impedance state.

If other example embodiments, the at least one CES element may be in a high impedance state, and the spiking neuron threshold may be the given by voltage $V_{set}$, i.e. the voltage required to switch a CES element out of the high impedance state. Once the CES element has been programmed into the high impedance state, the voltage across the CES element may be reduced, at least to below $V_{set}$, and possibly to below $V_{reset}$. The summed synaptic current may cause a voltage across the CES element to increase, and when the voltage across the CES element reaches/exceeds $V_{set}$, the current through the CES element will increase rapidly and exponentially as shown in FIG. 5 (step 1104). At step 1106, the spiking neuron may determine if the current flowing through the CES element indicates that the threshold of the neuron has been reached and if a spike is to be fired. If the current through the CES element has increased significantly/rapidly, the spiking neuron outputs a spike (step 1108). In embodiments, the increase in current may itself be considered the spike. If the current through the CES element has not increased significantly, indicating that the threshold of the neuron has been reached, the spiking neuron does not output a spike, and returns to step 1100 to await further input signals. If a spike is outputted by the spiking neuron, the spiking neuron is reset (step 1110) so that the spiking neuron is ready for the next cycle of integrating inputs and outputting a spike. In this example, the spiking neuron may be reset by removing any stored accumulated current, and by applying voltage $V_{reset}$ to the at least one CES element to switch the CES element back into the high impedance state.

Figure 12:
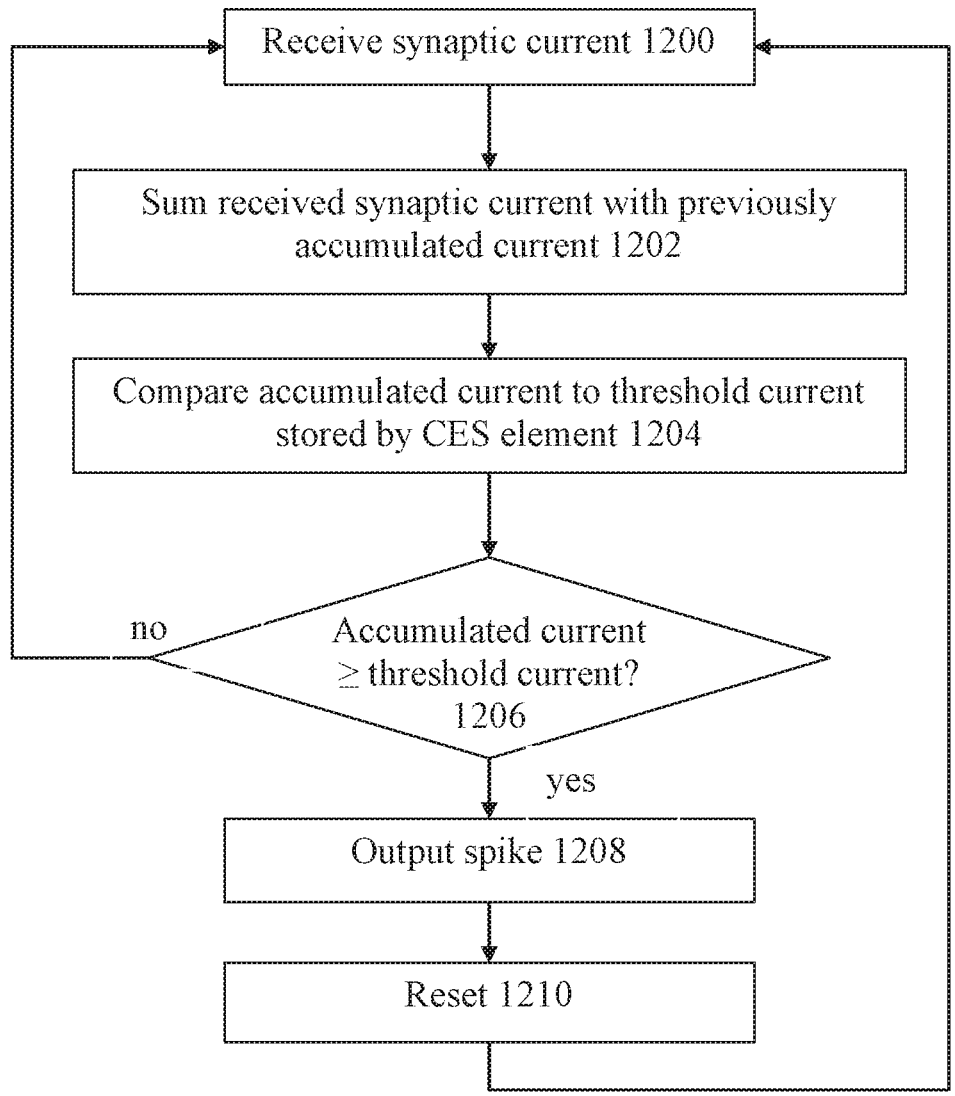
FIG. 12 is a flow diagram showing example operation steps of a neuron circuit comprising a CES element to store a threshold current.

As mentioned above, in embodiments, the spiking neuron may comprise one or more CES elements to store a threshold value associated with the spiking neuron. FIG. 12 is a flow diagram showing example operation steps of a neuron circuit comprising a CES element to store a threshold current. The process of FIG. 12 begins when the spiking neuron receives a synaptic current (or other synaptic signal from a synapse) as an input into the spiking neuron (step 1200). The spiking neuron adds/sums the received synaptic current with any previously accumulated current stored in the spiking neuron (step 1202). If the synaptic current received at step 1200 is received immediately after the spiking neuron has outputted a spike, then there will not be any previously accumulated current to add to the received synaptic current (as the spiking neuron is reset after outputting a spike/firing). One example technique for summing the received synaptic current with any previously accumulated current is described above with respect to FIGS. 8 and 9. Other example techniques for summing received synaptic signals with previously accumulated signals are described below with respect to FIGS. 13, 14 and 15.

Once the received synaptic current has been added to any previously accumulated current, the spiking neuron compares the summed current (accumulated current) to a threshold current value stored by a CES element of the spiking neuron (step 1204). The CES element which stores the threshold current value may do so by storing a compliance current. The CES element may be set into a particular low impedance state in order to store the compliance current corresponding to the threshold value of the spiking neuron.

At step 1206, the spiking neuron uses the comparison performed at step 1204 to determine if a spike is to be fired. Specifically, at step 1206 the spiking neuron determines if the summed current is greater than or equal to the threshold current stored by the CES element. If the summed current is determined to be greater than or equal to the threshold value, then the spiking neuron outputs a spike (step 1208). If the summed current is determined to be less than the threshold value, the spiking neuron does not output a spike, and returns to step 1200 to await further input signals. (The summed current is stored so that it can be added to the next input signal). If a spike is outputted by the spiking neuron, the spiking neuron is reset (step 1210) so that the spiking neuron is ready for the next cycle of integrating inputs and outputting a spike. In this example, the spiking neuron may be reset by removing any stored accumulated current.

Figure 13:
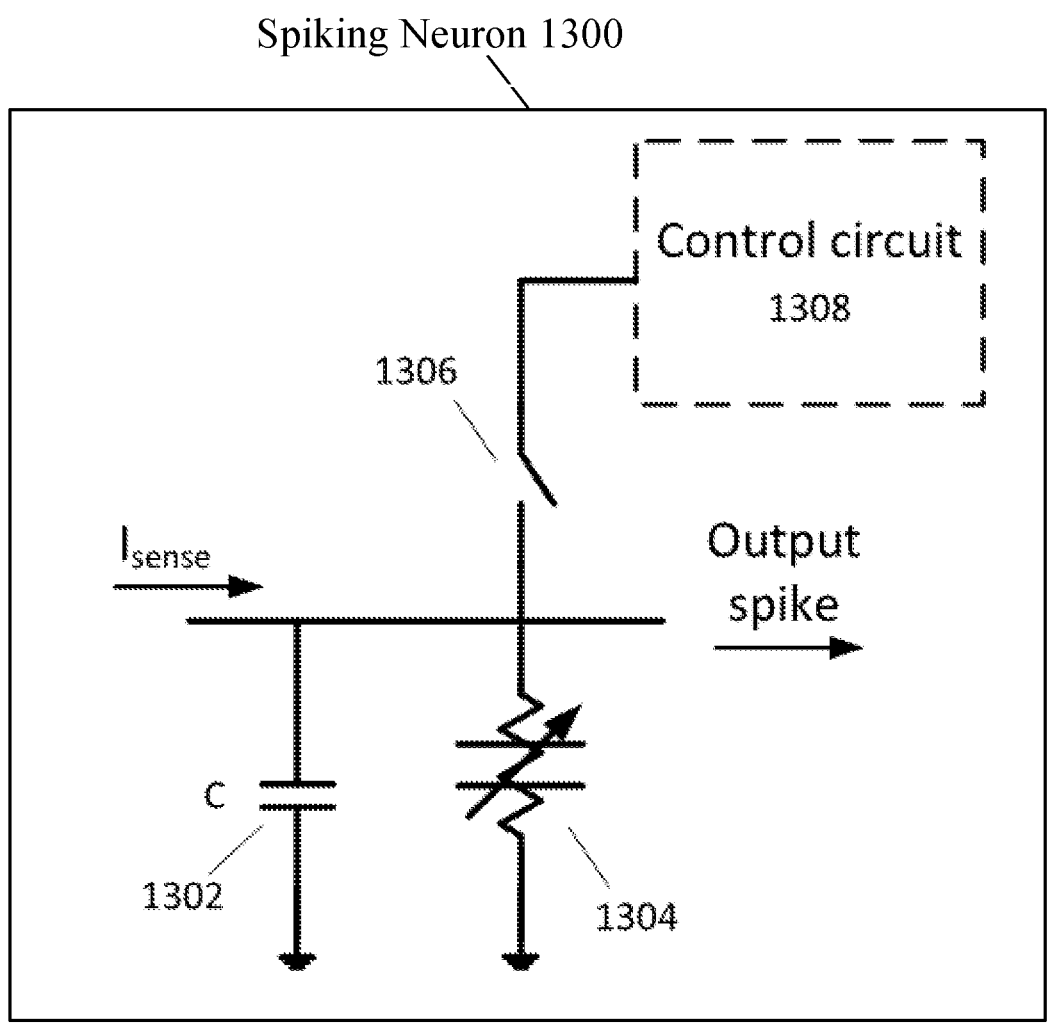
FIG. 13 is an example circuit diagram of a neuron circuit for integrating incoming synaptic currents and outputting a spike.

As mentioned earlier, there are a number of possible ways that a spiking neuron may perform the integrating/accumulating function. In the embodiment of FIG. 8, CES elements are used to accumulate incoming synaptic currents and store the accumulated current. However, in embodiments, a capacitor may be used to accumulate incoming synaptic currents. Turning now to FIG. 13, this shows an example circuit diagram of a neuron circuit 1300 comprising a capacitor for integrating incoming synaptic currents. The neuron circuit 1300 (also referred to as spiking neuron 1300) comprises a capacitor 1302 provided in parallel with a CES element 1304. The capacitor 1302 functions to accumulate incoming synaptic signals, e.g. synaptic currents. The CES element 1304 implements the thresholding function of the spiking neuron, which determines when the spiking neuron is to fire a spike. The circuit 1300 may operate in at least two different modes, depending on the default impedance state of the CES element 1304. These modes are described in turn below. The circuit 1300 may optionally comprise a control circuit 1308. In embodiments, the control circuit 1308 is located external to the neuron circuit 1300. In embodiments, at least one control circuit 1308 is located within the hardware-based spiking neural network and used to control one or more spiking neuron circuits 1300. In any case, the control circuit 1308 may be coupled to the CES element 1304 via switch 1306, and used to program the CES element 1304 into its default impedance state (and to reset the CES element 1304 into the default impedance state each time the spiking neuron circuit 1300 outputs a spike).

In an embodiment, the default impedance state of CES element 1304 is a low impedance state, and the circuit 1300 operates in a low impedance state mode. In this case, CES element 1304 is programmed into a low impedance state by control circuit 1308. As CES elements may be programmed into a plurality of low impedance states, based on the compliance current applied to the CES element, CES element 1304 effectively stores a compliance current once it has been programmed into a particular low impedance state. Once the programming is complete, control circuit 1308 is decoupled from CES element 1304 by opening switch 1306. Incoming synaptic signals (e.g. synaptic currents) are accumulated by capacitor 1302. As charge accumulates across capacitor 1302, the voltage across CES element 1304 increases. (At the start of each operation cycle of the spiking neuron 1300, the voltage across CES element 1304 is below $V_{reset}$). When the voltage across CES element 1304 reaches/exceeds $V_{reset}$ (as a result of the charge accumulation at the capacitor 1302) and when the current density across the CES element 1304 reaches $J_{reset}$, the CES element 1304 is reset and switches into a high impedance state. The switching, or change in impedance state, may be used by spiking neuron 1300 to generate an output spike. Additionally or alternatively, the switching itself may be considered the output spike of the circuit 1300.

If a spike is outputted by the spiking neuron 1300, the spiking neuron 1300 needs to be reset before it can be used for the next operation cycle. In this example, the spiking neuron 1300 may be reset by discharging the capacitor 1302 (thereby reducing the voltage across CES element 1304), and by setting the CES element 1304 back into the default impedance state (i.e. low impedance state). The control circuit 1308 may be recoupled to the CES element 1304 (via switch 1306) and used to apply the compliance current (and voltage $V_{set}$) to CES element 1304 to switch the CES element back into the associated low impedance state. Once programmed, the control circuit 1308 is decoupled from the CES element 1304.

An advantage of the low impedance state mode of circuit 1300 may be that the CES element 1304, and therefore the threshold value of the spiking neuron 1300, is programmable. As explained with respect to FIGS. 1 and 5, each low impedance state is associated with a different resistance ($R_{ON}$), such that a different current density $J_{reset}$ is required to switch a CES element into the high impedance state. For example, referring to FIG. 5, the voltage $V_{reset}$ required to switch a CES element in low impedance state $R_{ON1}$ and CES element in low impedance state $R_{ON2}$ into the high impedance state is the same. However, the current density $J_{reset}$ required to switch the CES element in state $R_{ON1}$ to a high impedance state is lower than the current density $J_{reset}$ required to switch the CES element in state $R_{ON2}$ to a high impedance state. Thus, in the low impedance state mode, CES element 1304 effectively stores a threshold value for the spiking neuron 1300, which specifies the current density required (and voltage required) to switch the CES element 1304 from the low impedance state to the high impedance state. Varying the compliance current (using control circuit 1308) applied to CES element 1304 to set the CES element 1304 into a particular low impedance state may enable the CES element 1304 to store one of a plurality of possible threshold values (current values). Thus, the spiking neural network architecture is more flexible and may be usable for a variety of different applications.

In an embodiment, the default impedance state of CES element 1304 is the high impedance state, and the circuit 1300 operates in a high impedance state mode. Here, the spiking neuron 1300 threshold may be the given by voltage $V_{set}$, i.e. the voltage required to switch a CES element out of the high impedance state. In this case, CES element 1304 is programmed into a high impedance state by control circuit 1308 (e.g. by applying voltage $V_{reset}$ to CES element 1304). Once the programming is complete, control circuit 1308 is decoupled from CES element 1304 by opening switch 1306. Incoming synaptic signals (e.g. synaptic currents) are accumulated by capacitor 1302. At the start of each operation cycle of the spiking neuron 1300, the voltage across CES element 1304 is at least below $V_{set}$ and may be below $V_{reset}$. As charge accumulates across capacitor 1302, the voltage across CES element 1304 increases from the start value. When the voltage across CES element 1304 reaches/exceeds $V_{set}$ (as a result of the charge accumulation at the capacitor 1302), the current through the CES element 1304 will increase rapidly and exponentially, as shown in FIG. 5. This sudden, rapid increase in current through CES element 1304 may be used by spiking neuron 1300 to determine that the threshold of the spiking neuron has been reached and an spike is to be outputted. Additionally or alternatively, the increase in current itself may be considered the output spike of the circuit 1300, since the current through the CES element 1304 will increase exponentially once the $V_{set}$ voltage has been exceeded. The magnitude of the output spike may be controlled by control circuit 1308.

If a spike is outputted by the spiking neuron 1300, the spiking neuron 1300 needs to be reset before it can be used for the next operation cycle. In this example, the spiking neuron 1300 may be reset by discharging the capacitor 1302 (thereby reducing the voltage across CES element 1304), and by setting the CES element 1304 back into the default impedance state (i.e. high impedance state). The control circuit 1308 may be recoupled to the CES element 1304 (via switch 1306) and used to apply voltage $V_{reset}$ to CES element 1304 to switch the CES element back into the high impedance state. Once programmed, the control circuit 1308 is decoupled from the CES element 1304.

An advantage of the high impedance state mode of circuit 1300 may be that the circuit consumes significantly less power than the low impedance state mode, because in the high impedance state, the impedance of the CES element is expected to be at least two orders of magnitude higher than in the low impedance state. This is because the CES element 1304 is in a high impedance state. However, the CES element 1304 may not be programmable in this operation mode.

Although a capacitor 1302 is used to apply a voltage across the CES element 1304, any other technique may be used to apply the required voltage across the CES element. For example, in some arrangements, the capacitor 1302 may be used to accumulate current, but an additional component may be used to bias the voltage across CES element 1304 in accordance with the impedance state of the CES element. For example, if the CES element 1304 is in a high impedance state, the CES element may be biased at $V_{set}$ using any appropriate component/circuitry, such that when the weighted and accumulated current into the neuron reaches $J_{set}$, the CES element switches out of the high impedance state and a rapid increase in current through the CES element will occur, as described above. If the CES element 1304 of neuron is in a low impedance state, the CES element may be biased at $V_{reset}$ using any appropriate component/circuitry, such that when the weighted and accumulated current into the neuron reaches $J_{reset}$, the CES element switches into a high impedance state, as described above. Thus, FIG. 13 merely shows one possible arrangement for accumulating incoming currents and increasing/applying a voltage across the CES element 1304.

Figure 14:
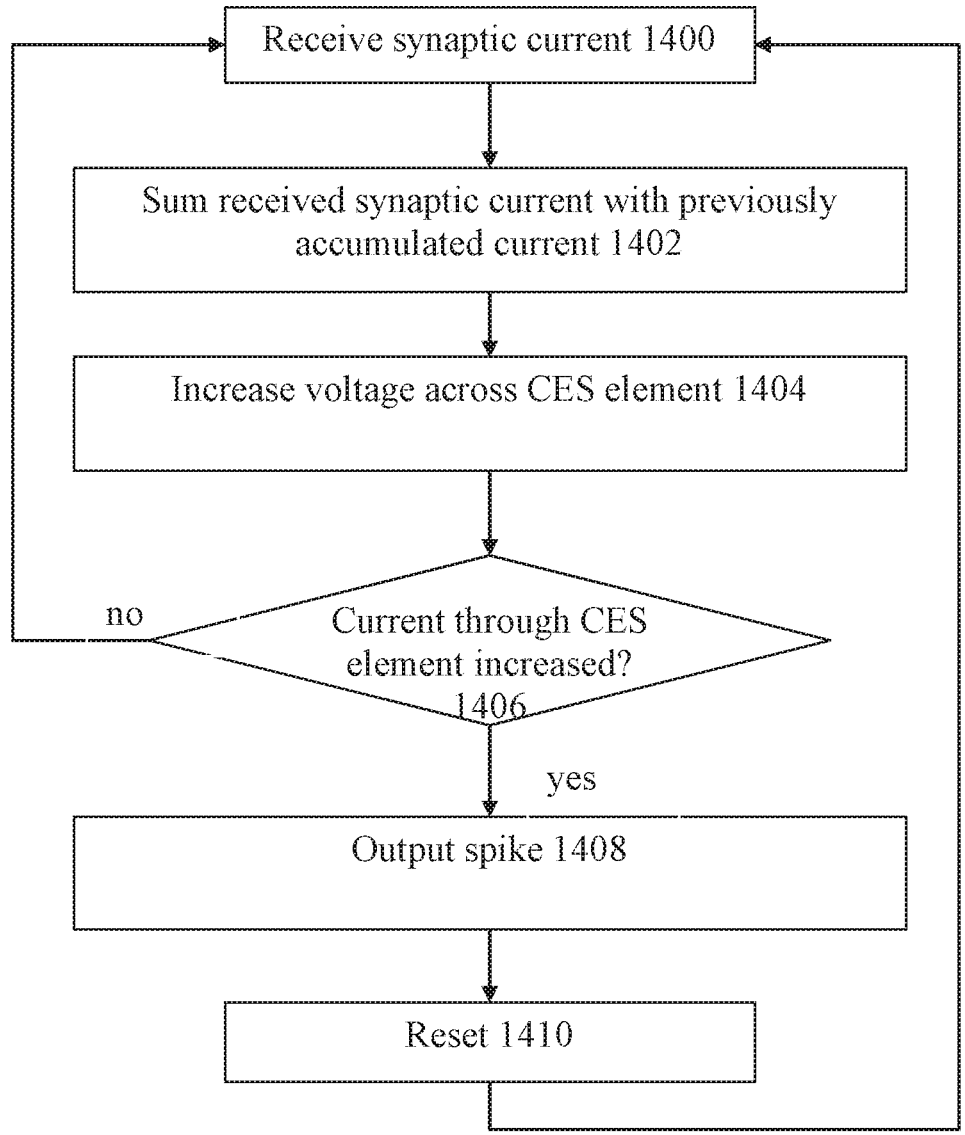
FIG. 14 is a flow diagram showing example operation steps of a neuron circuit comprising a CES element in a high resistance state.

FIG. 14 is a flow diagram showing example operation steps of a neuron circuit (such as neuron circuit 1300) comprising a CES element in a high impedance state. The CES element in the high impedance state is used to implement the thresholding function of the neuron circuit, which determines when the neuron circuit is to output a spike. In this embodiment, the threshold of the neuron circuit is the voltage $V_{set}$ across the CES element and a rapid increase in current through the CES element.

The process begins when the neuron circuit receives a synaptic current (or other synaptic signal from a synapse) as an input into the neuron (step 1400). The spiking neuron adds/sums the received synaptic current with any previously accumulated current stored in the spiking neuron (step 1402). If the synaptic current received at step 1400 is received immediately after the spiking neuron has outputted a spike, then there will not be any previously accumulated current to add to the received synaptic current (as the spiking neuron is reset after outputting a spike/firing). The neuron circuit may comprise a capacitor to accumulate current, as described above with respect to FIG. 13. As charge accumulates across the capacitor, the voltage across the CES element increases (step 1404). It will be understood that any other techniques or components may be used to accumulate incoming synaptic currents and to vary the voltage across the CES element.

At the start of each operation cycle of the spiking neuron, the voltage across the CES element is at least below $V_{set}$ and may be below $V_{reset}$. When the voltage across the CES element reaches/exceeds $V_{set}$ (as a result of the charge accumulation at the capacitor), the current through the CES element will increase rapidly and exponentially, as shown in FIG. 5. At step 1406, the spiking neuron may determine if the current flowing through the CES element has increased to a level that indicates that the threshold of the neuron has been reached and if a spike is to be fired. If the current through the CES element has increased significantly/rapidly, the spiking neuron outputs a spike (step 1408). In embodiments, the increase in current may itself be considered the spike. If the current through the CES element has not increased significantly, indicating that the threshold of the neuron has not been reached, the spiking neuron does not output a spike, and returns to step 1400 to await further input signals. If a spike is outputted by the spiking neuron, the spiking neuron is reset (step 1410) so that the spiking neuron is ready for the next cycle of integrating inputs and outputting a spike. The spiking neuron may be reset by discharging the capacitor (thereby reducing the voltage across CES element), and by setting the CES element back into the default impedance state (i.e. high impedance state).

Figure 15:
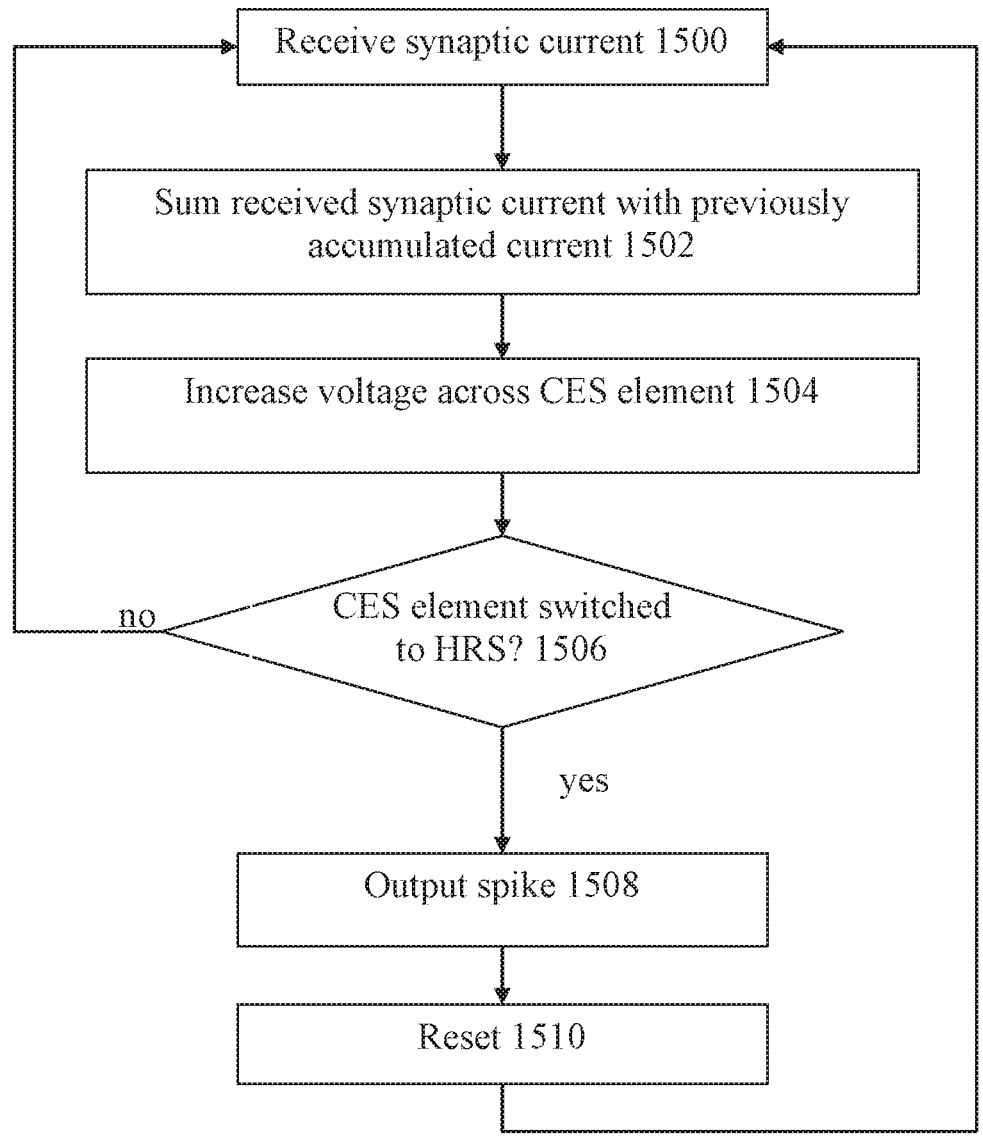
FIG. 15 is a flow diagram showing example operation steps of a neuron circuit comprising a CES element in a low resistance state.

FIG. 15 is a flow diagram showing example operation steps of a neuron circuit (such as neuron circuit 1300) comprising a CES element in a low impedance state. The CES element in a low impedance state is used to implement the thresholding function of the neuron circuit, which determines when the neuron circuit is to output a spike. In this embodiment, the threshold of the neuron circuit is the voltage $V_{reset}$ across the CES element and a current density $J_{reset}$ through the CES element, where the magnitude of $J_{reset}$ depends on the value of the compliance current used to set the CES element into the low impedance state.

The process begins when the neuron circuit receives a synaptic current (or other synaptic signal from a synapse) as an input into the neuron (step 1500). The spiking neuron adds/sums the received synaptic current with any previously accumulated current stored in the spiking neuron (step 1502). If the synaptic current received at step 1500 is received immediately after the spiking neuron has outputted a spike, then there will not be any previously accumulated current to add to the received synaptic current (as the spiking neuron is reset after outputting a spike/firing). The neuron circuit may comprise a capacitor to accumulate current, as described above with respect to FIG. 13. As charge accumulates across the capacitor, the voltage across the CES element increases (step 1504). It will be understood that any other techniques or components may be used to accumulate incoming synaptic currents and to vary the voltage across the CES element.

At the start of each operation cycle of the spiking neuron, the voltage across the CES element is below $V_{reset}$. As charge accumulates across capacitor, the voltage across the CES element increases. When the voltage across CES element reaches/exceeds $V_{reset}$ (as a result of the charge accumulation at the capacitor) and when the current density across the CES element reaches $J_{reset}$, the CES element is reset and switches into a high impedance state. At step 1506, the spiking neuron may determine if the CES element has switched into a high impedance state. If the CES element has switched into a high impedance state, the spiking neuron outputs a spike (step 1508). In embodiments, the switching or change in impedance state may itself be considered the output spike of the neuron. If the CES element has not switched into a high impedance state, the threshold of the spiking neuron has not been reached, the spiking neuron does not output a spike, and returns to step 1500 to await further input synaptic signals.

If a spike is outputted by the spiking neuron, the spiking neuron needs to be reset before it can be used for the next operation cycle. In this example, the spiking neuron may be reset by discharging the capacitor (thereby reducing the voltage across CES element), and by setting the CES element back into the default impedance state (i.e. low impedance state).

Figure 16:
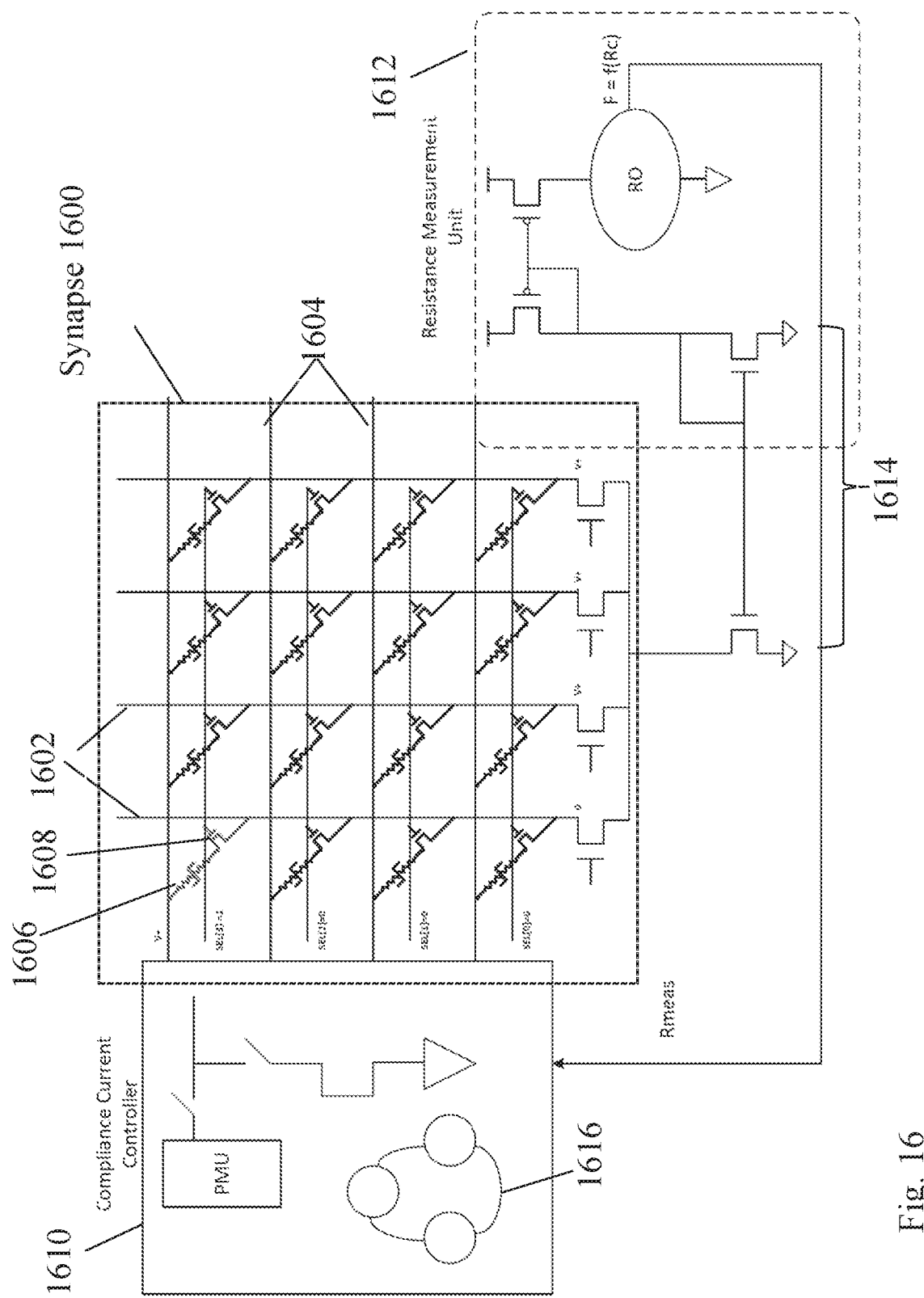
FIG. 16 is an example circuit diagram for calibrating a synapse comprising a crosspoint array formed of multiple CES elements.

As mentioned earlier, a synapse of a hardware-based spiking neural network may receive one or more inputs from neurons within the spiking neural network, and may output a synaptic signal which is received by one or more neurons as an input signal. In embodiments, the synapse may be provided by an array of resistive elements which provide a conductance matrix that enables input signals to be weighted, such that the synapse provides a weighted output. FIG. 16 is an example circuit diagram for calibrating a synapse 1600 comprising an array of resistive elements. The synapse 1600 may comprise an array of non-volatile memory elements, such as memristor or resistive RAM (ReRAM) elements. Preferably, the synapse 1600 comprises an array (e.g. a crosspoint array) of CES elements 1606. The array implements the synaptic weights of the synapse 1600. The crosspoint array of resistive elements may be used to sum the dot-product computation of weights and input signals into the synapse 1600, and output a signal (e.g. a synaptic current) as an input into a neuron. The crosspoint array may be an array of 'n' rows 1604 and 'm' columns 1602, where n and m are integers, and where n and m may be equal or different. Thus, the crosspoint array may be an n×m dimensional crosspoint array. A resistive element is provided at each intersection of a row 1604 and a column 1602 of the array. In the illustrated example, a CES element is shown at each intersection of a row 1604 and a column 1602.

Each CES element 1606 of the crosspoint array may be programmed into a particular impedance state in order to implement the synaptic weights into the array. The synapse 1600 may be used in at least two different operation modes. In one embodiment, the CES elements in the crosspoint array of the synapse 1600 may be used as digital weighting elements such that they are either in a high impedance state (0) or in a low impedance state (1). (This embodiment may be implemented using any type of non-volatile memory element or resistive element.) In another embodiment, the CES elements in the crosspoint array of the synapse 1600 may be used as 'analogue' weighting elements, such that they are either in a high impedance state or in one of a plurality of low impedance states. As explained earlier, by varying the compliance current applied to a CES element, each CES element 1606 may be set into a particular low impedance state. Thus, to program the CES elements into the required impedance state for the operation mode (and to achieve the required weights in the synapse), each CES element 1606 is coupled in series to a selecting transistor 1608 (or switching transistor, or diode, or similar component). The selecting transistor 1608 enables a CES element 1606 to be selected so that the CES element 1606 may be programmed into the required impedance state, without resetting/reprogramming any of the other CES elements in the array.

The example circuit shown in FIG. 16 to implement the synaptic weights into synapse 1600 comprises a compliance current control module 1610 and a resistance measuring module 1612. To store weights in the synapse 1600, each CES element 1606 is addressed by programming both the row and column voltages. Each row 1604 of the crosspoint array may be coupled to an access device that enables selection of a single CES element 1606 from the plurality of CES elements in a row, and thereby prevents accidental writes of other CES elements. In embodiments, to program a particular CES element 1606, the row signal line to which the CES element 1606 is coupled is programmed to a bias voltage, and the column signal line to which the CES element 1606 is coupled is programmed to 0V. All other rows in the crosspoint array are set to 0V so that all of the other CES elements are deselected. All other columns in the crosspoint array are programmed to V+ so that all of the other CES elements are deselected.

In order to implement the required synaptic weights into synapse 1600, each CES element 1606 in the crosspoint array needs to be set into a suitable impedance state. Accordingly, a technique for modulating the compliance current applied to each CES element is required, so that each CES element is set into the required impedance state. Once a CES element 1606 has been isolated/selected, the current flowing through the CES element 1606 is mirrored into the resistance measuring module 1612 using current mirror 1614. The resistance measuring module 1612 comprises a ring oscillator RO. The measured resistance determined by resistance measuring module 1612 is provided to the compliance current control module 1610. The compliance current control module 1610 comprises a power management unit PMU, and a hardware-based state machine 1616. The power management unit PMU may be used to modulate the gate voltage of, and the current through, the selected CES element 1606, and the resistance measuring module 1612 measures the resultant resistance/impedance of the CES element 1606. The measured impedance is sent back to compliance current control module 1610 to determine if the measured impedance of the CES element 1606 matches a required/target impedance. If the measured impedance (Rmeas) matches the target impedance, then the compliance current of the selected CES element 1606 has been determined and can be used to set the CES element 1606 into the required impedance state. If the measured impedance does not match the target impedance, then the compliance current control module 1610 may be used to vary the voltage/current until the target impedance is obtained.

This process is repeated for each of the CES elements 1606 of the crosspoint array. The CES elements 1606 may be set into different impedance states. Once the CES elements have been programmed into the required impedance states, all of the calibration circuitry is disconnected from the synapse 1600, such that the synapse 1600 is ready for use in a spiking neural network. The synapse 1600 may weight spikes outputted by one neuron before the spike signals are sent as inputs into another neuron. For example, the synaptic weights may be used to alter the strength or magnitude of signals outputted by one neuron before the signals are received as inputs by another neuron. This may be useful if the magnitude of the spike signals outputted by one neuron would cause a receiving neuron to spike immediately. The values of the synaptic weights may be determined by performing the neural network training offline, i.e. external to the hardware-based neural network itself.

Figure 17:
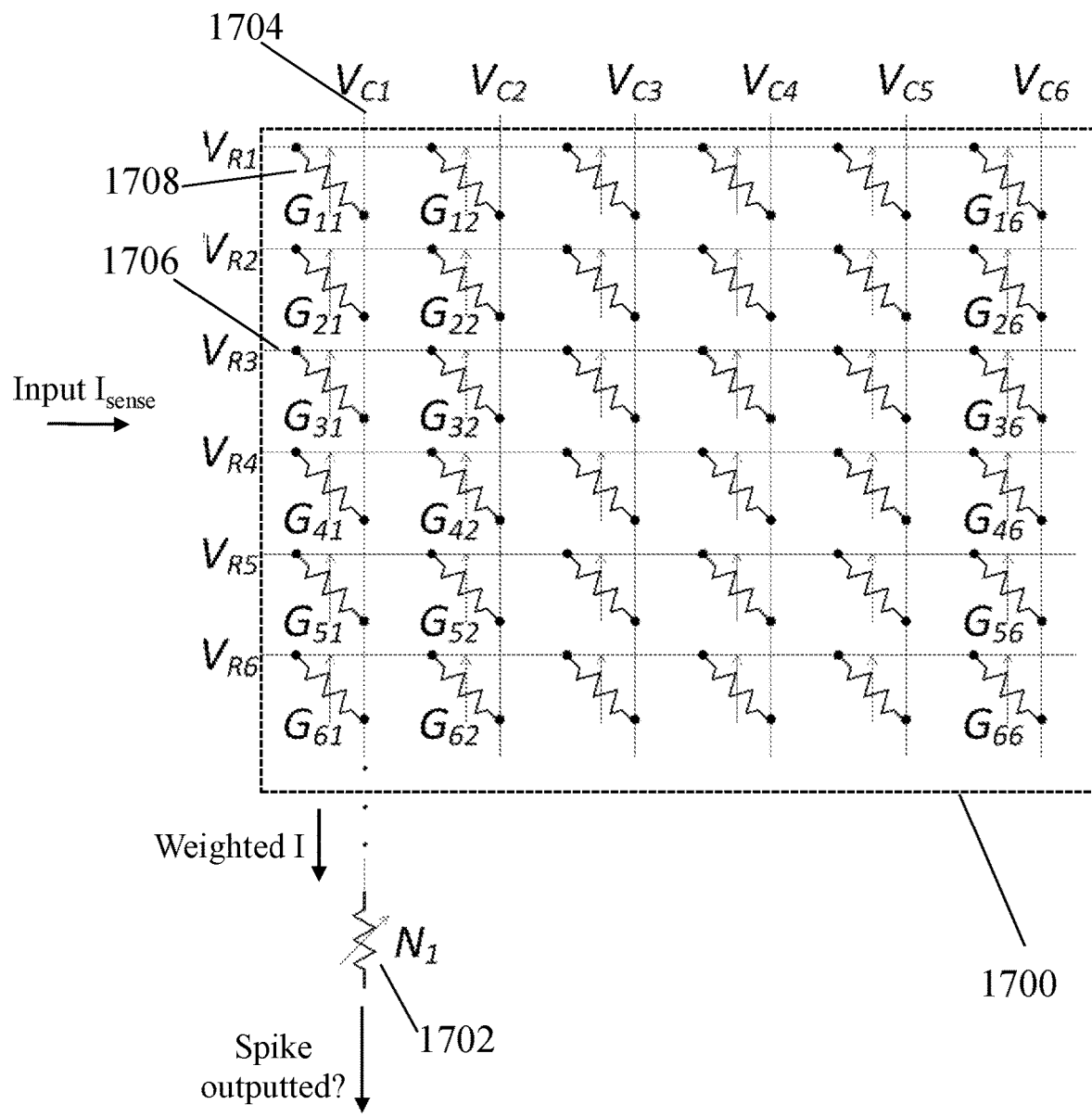
FIG. 17 is an example circuit diagram of a synapse crosspoint array formed of multiple CES elements.

FIG. 17 is an example circuit diagram of a synapse 1700 comprising multiple CES elements 1708. The synapse 1700 comprises an array of non-volatile memory elements, such as memristor or resistive RAM (ReRAM) elements. Preferably, the synapse 1700 comprises an array (e.g. a crosspoint array) of CES elements 1708. The array implements the synaptic weights of the synapse 1700. The crosspoint array of resistive elements may be used to sum the dot-product computation of weights and input signals into the synapse 1700, and output a signal (e.g. a synaptic current) as an input into a neuron. The crosspoint array may be an array of 'n' rows 1706 and 'm' columns 1704, where n and m are integers, and where n and m may be equal or different. Thus, the crosspoint array may be an n×m dimensional crosspoint array. In the non-limiting example shown in FIG. 17, the synapse 1700 comprises a 6×6 crosspoint array, with a total of 36 CES elements $G_{11}$ to $G_{66}$.

The synapse 1700 is coupled to one or more neurons 1702. In embodiments, a neuron may be coupled to each column 1704 of the crosspoint array. Thus, in the illustrated example, six neurons $N_1$ to $N_6$ may be coupled to the columns of the crosspoint array, but a single neuron 1702 is shown for the sake of simplicity. The neuron 1702 may be provided by any circuit or component able to measure current. In this case, the threshold of the neuron 1702 may be a specific current value, and when this current is measured through neuron 1702, the neuron outputs a spike. In embodiments, the neuron 1702 may be, or may comprise, a CES element. The CES element of neuron 1702 may be programmed into a high impedance state, or into one of a plurality of low impedance states, as described earlier.

The top terminals of the CES elements 1708 are coupled to the row signal lines 1706 of the crosspoint array, while the bottom terminals are coupled to the column signal lines 1704. Each CES element 1708 is programmed into a particular impedance state, as explained above. Accordingly, a synaptic voltage input $V_{Ri}$ into a row 1706 of the synapse 1700 is weighted by $G_{ij}$ to generate a weighted synaptic current $I_j$, such that a weighted current flows down a column 1704 to the neuron coupled to the column. It is this weighted current which is sensed. If multiple synaptic currents are input into the rows of the synapse 1700, the input currents are weighted and accumulated, such that a weighted and accumulated current flows down a column 1704 to the neuron coupled to the column. Each spike outputted by a pre-synaptic neuron (not shown) may be input into a separate row 1706 of the synapse 1700, such that the spikes may be accumulated and weighted before being received by the post-synaptic neuron 1702. The current $I_j$ flowing down the jth column of the synapse 1700 will be, according to Kirchhoff's Current Law, given by:

$$I_j = \sum_{i=1}^{n} V_{Ri} G_{ij} \quad \text{(Equation 2)}$$

where $V_{Ri}$ is the voltage of each row of the synapse, and $G_{ij}$ is the conductance of each CES element coupled to each row i and to the jth column.

If the CES element of neuron 1702 is in a high impedance state, the CES element is biased at $V_{set}$, such that when the weighted and accumulated current into the neuron 1702 reaches $J_{set}$, the CES element switches out of the high impedance state and a rapid increase in current through the CES element will occur, as described above. If the CES element of neuron 1702 is in a low impedance state, the CES element is biased at $V_{reset}$, such that when the weighted and accumulated current into the neuron 1702 reaches $J_{reset}$, the CES element switches into a high impedance state, as described above. In each case, the change in impedance state/conductivity is used to generate a spike by the neuron 1702. After one or more neurons have outputted a spike, the CES element of the neuron is reset to the default impedance state, so that the neuron is ready for the next cycle of operation.

Accordingly, in the embodiment shown in FIGS. 16 and 17, the synapse may be considered to perform the current accumulation/integration function, while the neuron performs the thresholding function. In each case, the ability to program CES elements into different impedance states is exploited.

Figure 18:
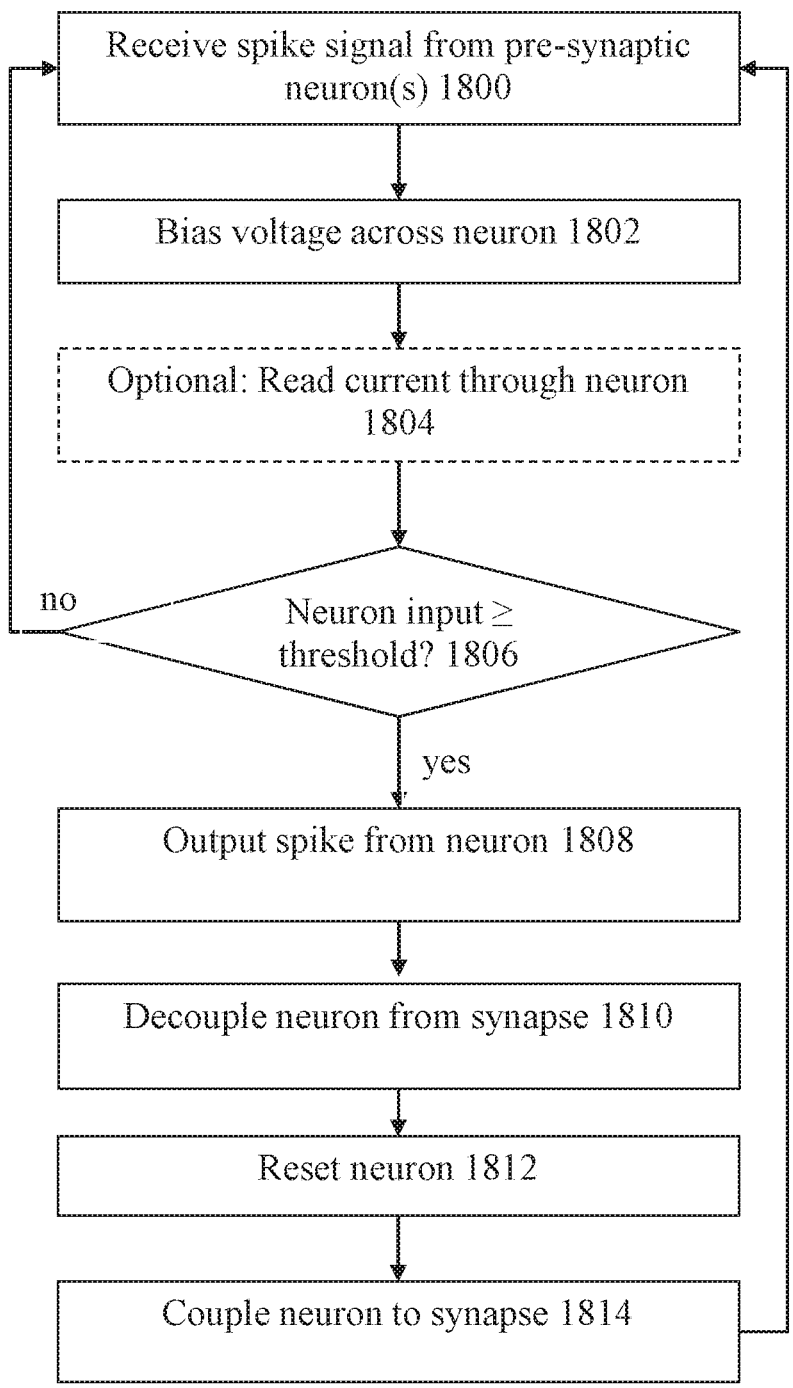
FIG. 18 is a flow diagram showing example operation steps of a neuron circuit coupled to the synapse crosspoint array of FIG. 17.

FIG. 18 is a flow diagram showing example operation steps of a neuron circuit coupled to a synapse comprising a crosspoint array (e.g. the synapse 1700 of FIG. 17). The process begins when the synapse receives a spike signal from a pre-synaptic neuron (step 1800). The spike signal may be a current signal. The spike current signal may be directed to a specific row of the crosspoint array of the synapse. The spike current will flow along the row(s) and columns of the crosspoint array, and will be weighted by the impedances of the resistive elements (e.g. CES elements) of the crosspoint array. A neuron is coupled to each column of the crosspoint array and receives, as an input, the current flowing down the column to which the neuron is coupled. In embodiments, the neuron is, or comprises, a CES element which is programmed into a particular impedance state to provide the thresholding function of the neuron. The voltage across each neuron is biased in accordance with the impedance state of the CES element (step 1802). For example, if the CES element is in a high impedance state, the CES element is biased at $V_{set}$, such that when the weighted and accumulated current into the neuron reaches $J_{set}$, the CES element switches out of the high impedance state and a rapid increase in current through the CES element will occur, as described above. If the CES element of neuron is in a low impedance state, the CES element is biased at $V_{reset}$, such that when the weighted and accumulated current into the neuron reaches $J_{reset}$, the CES element switches into a high impedance state, as described above. In embodiments, the neuron is, or comprises, a current measuring circuit. In this case, the current through the neuron is read (step 1804) to determine whether or not the neuron threshold has been reached/exceeded.

At step 1806, the neuron determines whether or not the inputs into the neuron have reached or exceeded the threshold. In the case of a CES element based neuron, this determination may be made by identifying whether the CES element has undergone a change in impedance state. In the case of a current measuring neuron, this determination may be made by measuring the current through the neuron and comparing the measured current to a threshold current. If the threshold is determined to have been reached/exceeded, the neuron outputs a spike signal (step 1808). If the threshold has not been reached, the process returns to step 1800. When the next spike signal is received, it may be directed to a different row of the synapse crosspoint array, such that the received spike signals may be accumulated by the synapse.

After the neuron has outputted a spike, the neuron may be decoupled from the synapse (step 1810), so that the neuron may be reset (step 1812). The neuron may be reset by the act of decoupling the neuron from the synapse, so that current no longer flows through the neuron. In embodiments where the neuron is/comprises a CES element, the neuron may be reset by reprogramming the CES element into its default impedance state. The spike current signals may also be disconnected/removed from the rows of the synapse. The neuron is then recoupled to the synapse (step 1814) ready for the next cycle of operation. Each neuron may be decoupled and reset when it has outputted a spike. Alternatively, all of the neurons coupled to the synapse may be decoupled and reset after all of the neurons have outputted spikes.

Further embodiments are set out in the following numbered clauses:

1. A spiking neuron for a spiking neural network, the spiking neuron comprising: a correlated electron switch (CES) element for implementing a thresholding function of the spiking neuron.
2. The spiking neuron as recited in clause 1 further comprising: an input node for receiving at least one signal from the spiking neural network; and an output node for outputting a spike signal.
3. The spiking neuron as recited in clause 2 wherein the at least one signal received at the input node is an accumulated signal from the spiking neural network.
4. The spiking neuron as recited in clause 2 further comprising: an accumulator circuit for summing signals received by the input node to provide an accumulated signal.
5. The spiking neuron as recited in clause 3 or 4 wherein the CES element stores a threshold value, and wherein the output node outputs the spike signal when the accumulated signal is greater than or equal to the threshold value.
6. The spiking neuron as recited in clause 5 wherein the accumulated signal is an accumulated current signal and the CES element stores a threshold current value.
7. The spiking neuron as recited in clause 6 wherein the CES element is programmed into an initial impedance state to store the threshold current value.
8. The spiking neuron as recited in clause 7 further comprising: means for coupling the spiking neuron to programming circuitry for applying a compliance current to the CES element and programming the CES element into the initial impedance state.
9. The spiking neuron as recited in any one of clauses 6 to 8 further comprising: a comparator circuit for: comparing the accumulated current signal with the threshold current value stored by the CES element, and outputting a spike if the accumulated current is greater than or equal to the threshold current value.
10. The spiking neuron as recited in clause 9 wherein the spiking neuron comprises a further CES element for storing the accumulated current signal as a compliance current.
11. The spiking neuron as recited in clause 10 wherein the comparator circuit comprises: a first mirror circuit for mirroring the accumulated current signal stored in the further CES element; and a second mirror circuit for mirroring the threshold current value stored by the CES element.
12. The spiking neuron as recited in clause 3 or 4 wherein the accumulated signal is an accumulated current signal and wherein the CES element is programmed into an initial high impedance state.
13. The spiking neuron as recited in clause 12 further comprising: circuitry for applying voltage Vset across the CES element, wherein the spiking neuron outputs a spike when the accumulated current signal exceeds a threshold current Iset and causes the CES element to switch out of the initial high impedance state.
14. The spiking neuron as recited in clause 3 or 4 wherein the accumulated signal is an accumulated current signal and wherein the CES element is programmed into one of a plurality of low impedance states.
15. The spiking neuron as recited in clause 14 further comprising: circuitry for applying voltage Vreset across the CES element, wherein the spiking neuron outputs a spike when the accumulated current signal exceeds a threshold current Ireset and causes the CES element to switch into a high impedance state.
16. The spiking neuron as recited in clause 13 or 15 wherein the circuitry for applying voltage Vset or Vreset across the CES element comprises a capacitor provided in a parallel arrangement with the CES element.
17. The spiking neuron as recited in any one of clauses 4 to 16 wherein the accumulator circuit for summing the signals received by the input node comprises a crosspoint array for applying weights to the received signals.
18. The spiking neuron as recited in clause 17 wherein the crosspoint array comprises: at least one row signal line and at least one column signal line; and a plurality of programmable CES elements provided at each intersection of a row signal line and a column signal line, wherein each CES element is programmable into a high impedance state or one of a plurality of low impedance states.
19. The spiking neuron as recited in clause 18 further comprising means for coupling the crosspoint array to calibration circuitry for writing the programmable CES elements.
20. A synapse for a spiking neural network, the synapse comprising: a crosspoint array comprising: at least one row signal line and at least one column signal line; and a plurality of programmable CES elements provided at each intersection of a row signal line and a column signal line, wherein each CES element is programmable into a high impedance state or one of a plurality of low impedance states.
21. The synapse as recited in clause 20 further comprising: input nodes coupled to each row signal line, for receiving current signals from the spiking neural network; and output nodes coupled to each column signal line, wherein each output node is couplable to a spiking neuron.
22. The synapse as recited in clause 20 or 21 further comprising: circuitry for coupling the crosspoint array to calibration circuitry for writing the programmable CES elements into a required impedance state.
23. A method of outputting spike signals from a spiking neuron, the method comprising: using a correlated electron switch (CES) element to implement a thresholding function of the spiking neuron.
24. The method as recited in clause 23 further comprising: accumulating two or more current signals received from the spiking neural network to provide an accumulated current signal; and outputting a spike signal.
25. The method as recited in clause 24 wherein the CES element stores a threshold current, the method further comprising: comparing the stored threshold current and the accumulated current signal; determining if the accumulated current signal is greater than or equal to the stored threshold current; and outputting, responsive to the determining, the spike signal.
26. The method as recited in clause 24 further comprising: programming the CES element into one of a plurality of low impedance states to store a threshold current value; and applying, subsequent to the programming, a voltage Vreset across the CES element.
27. The method as recited in clause 26 further comprising: outputting the spike signal when the accumulated current signal exceeds a threshold current Ireset and causes the CES element to switch out of the low impedance state.
28. The method as recited in clause 24 further comprising: programming the CES element into a high impedance state to store a threshold current value; and applying, subsequent to the programming, a voltage Vset across the CES element.
29. The method as recited in clause 28 further comprising: outputting the spike signal when the accumulated current signal exceeds a threshold current Iset and causes the CES element to switch out of the high impedance state.
30. The method as recited in any one of clauses 24 to 29 further comprising: resetting the spiking neuron subsequent to outputting a spike signal.

31. A spiking neural network comprising: a plurality of spiking neurons according to any of clauses 1 to 16; and at least one synapse according to any of clauses 20 to 22, the synapse couplable to two or more of the plurality of spiking neurons.

Those skilled in the art will appreciate that while the foregoing has described what is considered to be the best mode and where appropriate other modes of performing present techniques, the present techniques should not be limited to the specific configurations and methods disclosed in this description of various example embodiments. Those skilled in the art will recognise that present techniques have a broad range of applications, and that the embodiments may take a wide range of modifications without departing from the any inventive concept as defined in the appended claims.

What is claimed is:

1. A spiking neuron for a spiking neural network, the spiking neuron comprising:
a correlated electron switch (CES) element for implementing a thresholding function of the spiking neuron;
an accumulator circuit for summing current signals received by the spiking neuron to provide an accumulated current signal;
a further CES element for storing the accumulated current signal as a compliance current;
wherein the CES element stores a threshold current value corresponding to a compliance current, the spiking neuron further including:
a comparator circuit for comparing the accumulated current signal with the threshold current value stored by the CES element and outputting a spike signal if the accumulated current signal is greater than or equal to the threshold current value, the comparator circuit including:
a first mirror circuit for mirroring the accumulated current signal stored in the further CES element; and
a second mirror circuit for mirroring the threshold current value stored by the CES element.

2. The spiking neuron as claimed in claim 1 wherein the CES element is programmed into an initial high impedance state, and the spiking neuron further comprises:
circuitry for applying voltage Vset across the CES element,
wherein the spiking neuron outputs a spike when the accumulated current signal exceeds a threshold current Iset and causes the CES element to switch out of the initial high impedance state.

3. A spiking neuron for a spiking neural network, the spiking neuron comprising:
a correlated electron switch (CES) element for implementing a thresholding function of the spiking neuron
an accumulator circuit for summing current signals received by the spiking neuron to provide an accumulated current signal,
wherein the CES element is programmed into one of a plurality of low impedance states, and the spiking neuron further comprises:
circuitry for applying voltage Vreset across the CES element,
wherein the spiking neuron outputs a spike when the accumulated current signal exceeds a threshold current Ireset, and causes the CES element to switch into a high impedance state upon application of voltage Vreset.

4. The spiking neuron as claimed in claim 3 wherein the circuitry for applying voltage Vreset across the CES element comprises a capacitor provided in a parallel arrangement with the CES element.

5. A spiking neuron for a spiking neural network, the spiking neuron comprising:
a correlated electron switch (CES) element for implementing a thresholding function of the spiking neuron
an accumulator circuit for summing current signals received by the spiking neuron to provide an accumulated current signal,
wherein the accumulator circuit for summing the signals received by the input node comprises a crosspoint array for applying weights to the received signals.

6. A synapse for a spiking neural network, the synapse comprising:
a crosspoint array comprising:
at least one row signal line and at least one column signal line; and
a plurality of programmable CES elements provided at each intersection of a row signal line and a column signal line, wherein each CES element is programmable into a high impedance state or one of a plurality of low impedance states.

7. The synapse as claimed in claim 6 further comprising:
input nodes coupled to each row signal line, for receiving current signals from the spiking neural network; and
output nodes coupled to each column signal line, wherein each output node is couplable to a spiking neuron.

8. The synapse as claimed in claim 6 further comprising:
circuitry for coupling the crosspoint array to calibration circuitry for writing the programmable CES elements into a required impedance state.

9. A method of outputting spike signals from a spiking neuron, the method comprising:
using a correlated electron switch (CES) element to implement a thresholding function of the spiking neuron, wherein the CES element stores a threshold current;
accumulating two or more current signals received from the spiking neural network to provide an accumulated current signal;
outputting a spike signal;
comparing the stored threshold current and the accumulated current signal;
determining if the accumulated current signal is greater than or equal to the stored threshold current; and
outputting, responsive to the determining, the spike signal.

10. The method as claimed in claim 9 further comprising:
programming the CES element into one of a plurality of low impedance states to store a threshold current value; and
applying, subsequent to the programming, a voltage Vreset across the CES element.

11. The method as claimed in claim 10 further comprising:
outputting the spike signal when the accumulated current signal exceeds a threshold current Ireset and causes the CES element to switch out of the low impedance state upon application of voltage Vreset.

12. The method as claimed in claim 9 further comprising:
programming the CES element into a high impedance state to store a threshold current value; and
applying, subsequent to the programming, a voltage Vset across the CES element.

13. The method as claimed in claim 12 further comprising:
   outputting the spike signal when the accumulated current signal exceeds a threshold current Iset and causes the CES element to switch out of the high impedance state.

14. The method as claimed in claim 9 further comprising:
   resetting the spiking neuron subsequent to outputting a spike signal.

\* \* \* \* \*